(12) United States Patent
Shiraki et al.

(10) Patent No.: US 7,799,667 B2
(45) Date of Patent: Sep. 21, 2010

(54) METHOD FOR MANUFACTURING SEMICONDUCTOR DEVICE WITH PLANER GATE ELECTRODE AND TRENCH GATE ELECTRODE

(75) Inventors: Satoshi Shiraki, Toyohashi (JP); Yoshiaki Nakayama, Okazaki (JP); Shoji Mizuno, Okazaki (JP); Takashi Nakano, Nukata-gun (JP); Akira Yamada, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 43 days.

(21) Appl. No.: 12/219,008

(22) Filed: Jul. 15, 2008

(65) Prior Publication Data
US 2008/0293202 A1 Nov. 27, 2008

Related U.S. Application Data

(62) Division of application No. 10/864,518, filed on Jun. 10, 2004, now abandoned.

(30) Foreign Application Priority Data

Jun. 13, 2003 (JP) ............................. 2003-170019
Mar. 4, 2004 (JP) ............................. 2004-061077

(51) Int. Cl.
*H01L 21/336* (2006.01)
(52) U.S. Cl. ................. 438/589; 438/270; 438/276; 257/330
(58) Field of Classification Search .......... 438/270, 438/589
See application file for complete search history.

(56) References Cited

U.S. PATENT DOCUMENTS 5,828,101 A 10/1998 Endo 6,118,149 A 9/2000 Nakagawa et al.
6,198,131 B1 3/2001 Tung (Continued)

FOREIGN PATENT DOCUMENTS

JP A-S52-42078 4/1977

(Continued)

OTHER PUBLICATIONS

Partial European Search Report dated Aug. 5, 2009 issued from the European Patent Office in corresponding European patent application No. 04013680.6—2203.

(Continued)

*Primary Examiner*—Wael M Fahmy
*Assistant Examiner*—Abul Kalam
(74) *Attorney, Agent, or Firm*—Posz Law Group, PLC

(57) ABSTRACT

A semiconductor device includes: a semiconductor substrate with a principal plane; a base region disposed on the principal plane; a source region disposed on the principal plane in the base region to be shallower than the base region; a drain region disposed on the principal plane, and spaced to the base region; a trench disposed on the principal plane; a trench gate electrode disposed in the trench through a trench gate insulation film; a planer gate electrode disposed on the principal plane of the semiconductor substrate through a planer gate insulation film; and an impurity diffusion region having high concentration of impurities and disposed in a portion of the base region to be a channel region facing the planer gate electrode.

3 Claims, 26 Drawing Sheets

U.S. PATENT DOCUMENTS

| | | |
|---|---|---|
| 6,362,025 B1 | 3/2002 | Patti et al. |
| 6,452,231 B1 | 9/2002 | Nakagawa et al. |
| 6,525,375 B1 | 2/2003 | Yamaguchi et al. |
| 6,696,323 B2 | 2/2004 | Yamaguchi et al. |
| 6,972,458 B2 | 12/2005 | Suzuki et al. |
| 2001/0012663 A1 | 8/2001 | Magri et al. |
| 2001/0030347 A1 | 10/2001 | Yamauchi et al. |
| 2002/0043699 A1 | 4/2002 | Akiyama |
| 2002/0093064 A1* | 7/2002 | Inaba ................ 257/408 |
| 2006/0001084 A1 | 1/2006 | Kelly et al. |

FOREIGN PATENT DOCUMENTS

| | | |
|---|---|---|
| JP | A-59-228762 | 12/1984 |
| JP | A-H08-204195 | 8/1996 |
| JP | A-2001-127287 | 5/2001 |

OTHER PUBLICATIONS

European Search Report dated November 24, 2009 issued from the European Patent Office in corresponding European patent application No. 04013680.6—2203.

* cited by examiner

FIG. 9
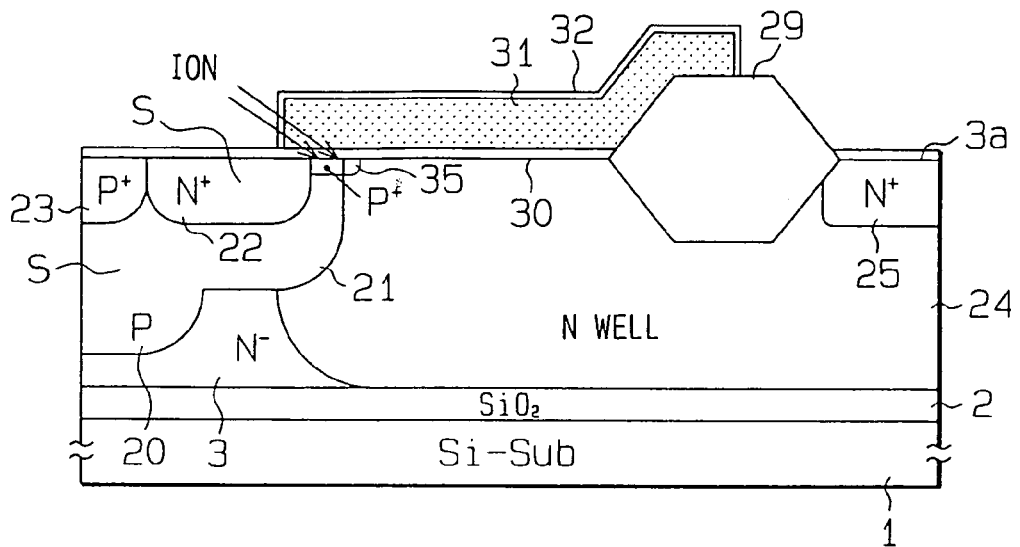
FIG. 10A
FIG. 10C
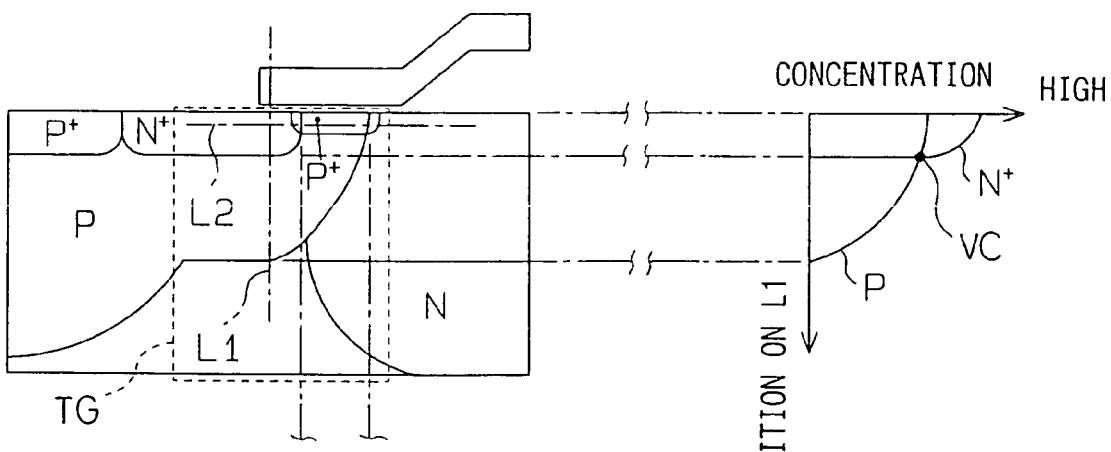
FIG. 10B
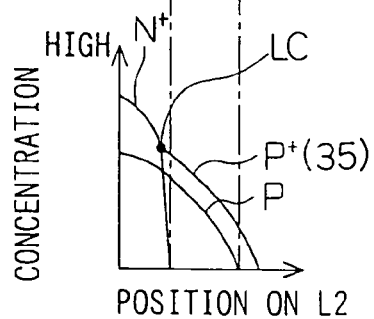

METHOD FOR MANUFACTURING SEMICONDUCTOR DEVICE WITH PLANER GATE ELECTRODE AND TRENCH GATE ELECTRODE

CROSS REFERENCE TO RELATED APPLICATIONS

This application is a divisional of U.S. patent application Ser. No. 10/864,518, filed on Jun. 10, 2004 and entitled SEMICONDUCTOR DEVICE AND METHOD FOR MANUFACTURING THE SAME, and is based on Japanese Patent Applications No. 2003-170019 filed on Jun. 13, 2003, and No. 2004-61077 filed on Mar. 4, 2004, the disclosures of which are incorporated herein by reference.

FIELD OF THE INVENTION

The present invention relates to a semiconductor device and a method for manufacturing the same.

BACKGROUND OF THE INVENTION

A planer gate lateral type power device is well known. This device includes a planer gate construction. In the device, current flows shallowly so that an on-state resistance becomes large.

SUMMARY OF THE INVENTION

The present invention is provided in view of the above background knowledge. It is an object of the present invention to provide a semiconductor device and a method for manufacturing the semiconductor device, in which current in a vertical direction flows by a trench gate easily so that an on-state resistance is reduced.

A semiconductor device is characterized by including an impurity diffusion region having the second conductive type, having high concentration of impurities, and disposed in a portion of the base region to be a channel region facing the planer gate electrode. Thus, the impurity concentration of the channel region facing the trench gate electrode and the impurity concentration of the channel region facing the planer gate electrode have following relationship such that the impurity concentration of the channel region facing the planer gate electrode becomes higher. Therefore, the Vt value in case of flowing the current through the channel region facing the trench gate electrode and the Vt value in case of flowing the current through the channel region facing the planer gate electrode have following relationship such that the Vt value in case of flowing the current through the channel region facing the planer gate electrode becomes higher. As a result, the current in the vertical direction flows by the trench gate easily, compared with a conventional construction. Thus, reduction of the on-state resistance is improved.

A semiconductor device is characterized by including the impurity diffusion region having the second conductive type, having low concentration of impurities, and disposed in a portion of the base region to be a channel region facing the trench gate electrode. Thus, the impurity concentration of the channel region facing the trench gate electrode and the impurity concentration of the channel region facing the planer gate electrode have following relationship such that the impurity concentration of the channel region facing the trench gate electrode becomes lower. Therefore, the Vt value in case of flowing the current through the channel region facing the trench gate electrode and the Vt value in case of flowing the current through the channel region facing the planer gate electrode have following relationship such that the Vt value in case of flowing the current through the channel region facing the trench gate electrode becomes lower. As a result, the current in the vertical direction flows by the trench gate easily, compared with a conventional construction. Thus, reduction of the on-state resistance is improved.

A semiconductor device is characterized by including a base region composing a bulk portion except for a well region having a first conductive type, the well region to be a drift region disposed on a principal plane of a semiconductor substrate having a second conductive type. Thus, the impurity concentration of the channel region facing the trench gate electrode and the impurity concentration of the channel region facing the planer gate electrode have following relationship such that both impurity concentrations become equal. Therefore, the Vt value in case of flowing the current through the channel region facing the trench gate electrode and the Vt value in case of flowing the current through the channel region facing the planer gate electrode have following relationship such that both Vt values become equal. As a result, the current in the vertical direction flows by the trench gate easily, compared with a conventional construction. Thus, reduction of the on-state resistance is improved.

A semiconductor device is characterized by including: a planer gate electrode disposed on the principal plane through a planer gate insulation film, wherein the planer gate electrode is an independent part independent from the trench gate electrode; a trench gate wiring for applying a first gate voltage to the trench gate electrode; and a planer gate wiring for applying a second gate voltage to the planer gate electrode. Thus, the voltage applied to the planer gate electrode and the voltage applied to the trench gate are controlled independently so that the current can be controlled to flow in the vertical direction more easily than that in the lateral direction. Thus, the current flows deeply and a channel density is improved, so that the on-state resistance is reduced.

A semiconductor device is characterized by including: a trench gate electrode disposed in the trench through a trench gate insulation film; and a planer gate electrode disposed on the principal plane through a planer gate insulation film, wherein the planer gate insulation film is thicker than the trench gate insulation film. Therefore, the Vt value in case of flowing the current through the channel region facing the planer gate electrode becomes higher than the Vt value in case of flowing the current through the channel region facing the trench gate electrode. As a result, the current in the vertical direction flows by the trench gate easily, so that the reduction of the on-state resistance is improved.

Preferably, the semiconductor device further includes: an insulation film is disposed on an inner wall of a device separation trench disposed around a device-to-be-formed region of the semiconductor substrate, the insulation film being the same film as the trench gate insulation film for the trench gate electrode; a film is disposed in the device separation trench through the insulation film, the film being the same film as a film composing the trench gate electrode; and another insulation film is disposed in the device separation trench through the film. In this case, a device separation withstand voltage is sufficiently secured. Further, parts for composing the trench gate (i.e., the trench, the trench gate insulation film and the trench gate electrode) and parts for composing the trench separation (i.e., the device separation trench, the insulation film, films disposed inside the insulation film) are formed at the same time.

Preferably, the semiconductor device further includes: an insulation film is disposed on an inner wall of a device separation trench disposed around a device-to-be-formed region of the semiconductor substrate, the insulation film being thicker than the trench gate insulation film of the trench gate electrode; and a film is disposed in the device separation trench through the insulation film, the film being the same film as a film composing the trench gate electrode. In this case, the device separation withstand voltage is sufficiently secured. Further, parts for composing the trench gate (i.e., the trench, the trench gate insulation film and the trench gate electrode) and parts for composing the trench separation (i.e., the device separation trench, the insulation film, films disposed inside the insulation film) are formed at the same time.

Preferably, the semiconductor device further includes: a device separation trench is disposed around a device-to-be-formed region of the semiconductor substrate, the device separation trench being equal to or more than double trenches; an insulation film is formed on an inner wall of each trench, respectively, the insulation film being the same film as the trench gate insulation film of the trench gate electrode; and a film is disposed in the device separation trench through the insulation film, the film being the same film as a film composing the trench gate electrode. In this case, the device separation withstand voltage is sufficiently secured. Further, parts for composing the trench gate (i.e., the trench, the gate insulation film and the trench gate electrode) and parts for composing the trench separation (i.e., the device separation trench, the insulation film, films disposed inside the insulation film) are formed at the same time.

A method for manufacturing a semiconductor device includes the steps of: forming the trench on the principal plane of the semiconductor substrate having the first conductive type; forming the gate insulation film on the principal plane of the semiconductor substrate including the inner wall of the trench; forming the planer gate electrode on the principal plane of the semiconductor substrate through the gate insulation film together with forming the trench gate electrode in the trench through the gate insulation film; forming the source region having the first conductive type by an ion implantation method with using the planer gate electrode as a mask together with forming the base region having the second conductive type; and increasing an impurity concentration by implanting ions of the second conductive type element at a slant into a portion of the base region to be a channel region facing the planer gate electrode. As a result, the method provides the semiconductor device.

A method for manufacturing a semiconductor device includes the steps of: forming the trench on the principal plane of the semiconductor substrate having the first conductive type; forming the gate insulation film on the principal plane of the semiconductor substrate including the inner wall of the trench; forming the trench gate electrode in the trench through the gate insulation film; forming the source region having the first conductive type together with the base region having the second conductive type; increasing an impurity concentration by implanting ions of the second conductive type element into a portion of the base region to be a channel region facing the planer gate electrode, the portion disposed on the surface portion of the principal plane of the semiconductor substrate; and forming the planer gate electrode on the principal plane through the gate insulation film. As a result, the method provides the semiconductor device.

BRIEF DESCRIPTION OF THE DRAWINGS

The above and other objects, features and advantages of the present invention will become more apparent from the following detailed description made with reference to the accompanying drawings. In the drawings:

FIG. 9 is a cross sectional view explaining the method for manufacturing the transistor of the semiconductor device according to the first embodiment;

FIG. 10A is a schematic cross sectional view showing a trench gate of the transistor of the semiconductor device, and FIGS. 10B and 10C are graphs showing a concentration distribution, according to the first embodiment;

DETAILED DESCRIPTION OF THE PREFERRED EMBODIMENTS

Figure 38A:
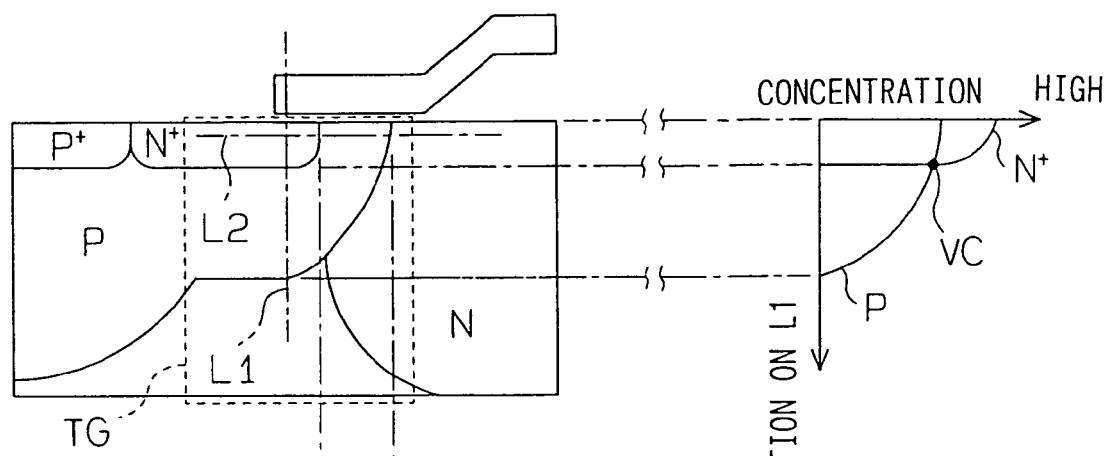
FIG. 38A is a schematic cross sectional view showing a trench gate.
Figure 38C:
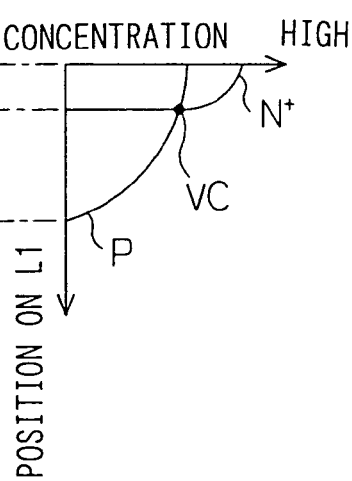
FIGS. 38B and 38C are graphs showing a concentration distribution, according to preliminary study.
Figure 38B:
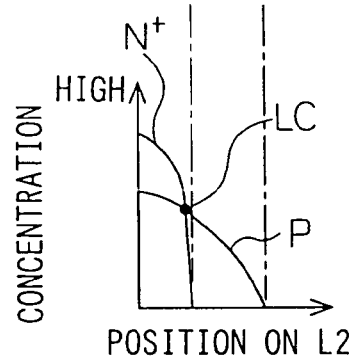

The inventors have preliminarily studied about a concentration of a diffusion layer, which defines both of a threshold voltage Vt in case of flowing current in a lateral direction by a planer gate PG and a threshold voltage Vt in case of flowing current in a vertical direction by a trench gate TG. As a result, as shown in FIGS. 38A-38C, a concentration at a connecting portion LC in the lateral direction is $1.6 \times 10^{17}/cm^3$, and a concentration at a connecting portion VC in the vertical direction is $8 \times 10^{17}/cm^3$. Thus, when the concentration of the connecting portion VC in the vertical direction is higher than that LC in the lateral direction, the threshold voltage Vt in case of flowing current in the vertical direction becomes higher than that in the lateral direction. Accordingly, the trench suppresses the current from flowing deeply, so that it is difficult to reduce an on-state resistance.

In view of the above result, a semiconductor device with using both of a trench gate TG and a planer gate PG is provided. The device provides reduction of an on-state resistance, compared with a conventional planer gate lateral type power device. The reduction is performed by flowing current deeply and by improving a channel density.

First Embodiment

A first embodiment embodied with the present invention is described as follows with reference to the drawings.

Figure 1:
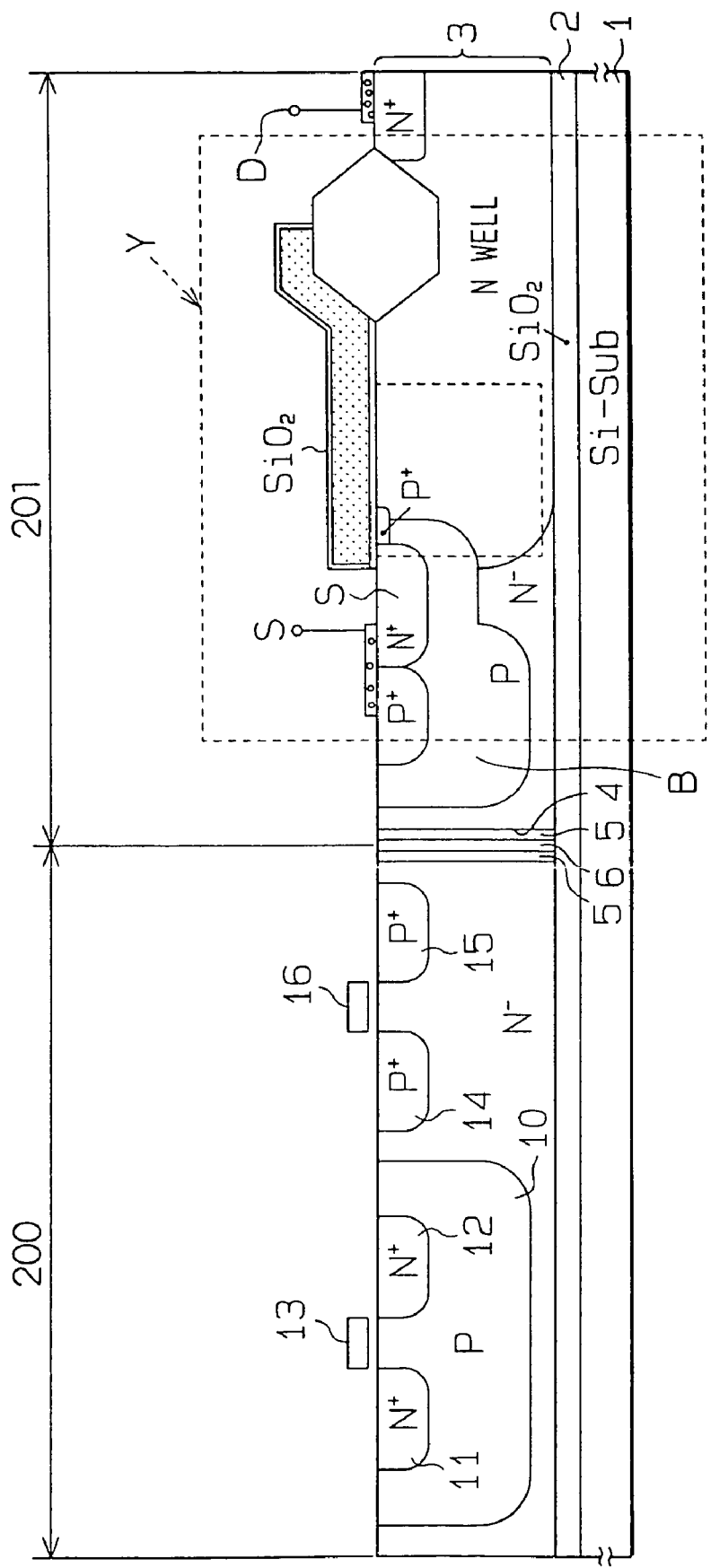
FIG. 1 is a cross sectional view showing a semiconductor device according to a first embodiment of the present invention.

FIG. 1 is a cross sectional view showing a semiconductor device according to the first embodiment of the present invention. In this embodiment, a SOI (i.e., silicon on insulator) substrate is used. Specifically, a thin single crystal silicon layer (i.e., a single crystal semiconductor layer) 3 is formed on a silicon substrate 1 through an insulation film (i.e., a silicon oxide film) 2 so that the SOI substrate is prepared. A device separation trench 4 is formed in the single crystal silicon layer 3 to reach the insulation film 2. Multiple device-to-be-formed islands is formed and zoned by the trench 4. With respect to the device separation trench 4, a silicon oxide film 5 is formed on a sidewall of the trench 4. A poly silicon film 6 is filled in the trench 4 through the silicon oxide film 5. In FIG. 1, the first device-to-be-formed island provides a logic portion 200. In the logic portion 200, a CMOS (i.e., complementary metal-oxide-semiconductor) transistor is formed. The second device-to-be-formed island provides a power MOS (i.e., metal-oxide semiconductor) portion 201, and a lateral type power MOS transistor (i.e., trench gate type LDMOS transistor) is formed therein. Here, LDMOS transistor is a laterally diffused metal-oxide semiconductor transistor. With respect to the following, a N conductive type represents the first conductive type, and a P conductive type represents the second conductive type.

In the logic portion 200, with respect to the CMOS transistor as a N channel MOS transistor, a P type well region 10 is formed on a surface portion of the silicon layer 3 as a N⁻ type silicon layer. A N⁺ type source region 11 and a N⁺ type drain region 12 are formed on a surface portion of the P type well region 10 to separate each other. A gate electrode 13 is disposed on the P type well region 10 through a gate oxide film (not shown). On the other hand, with respect to a P type channel MOS transistor, a P⁺ type source region 14 and a P⁺ type drain region 15 are formed on the surface portion of the N⁻ type silicon layer 3 to separate each other. A gate electrode 16 is disposed on the N⁻ type silicon layer 3 through a gate oxide film (not shown).

Figure 2:
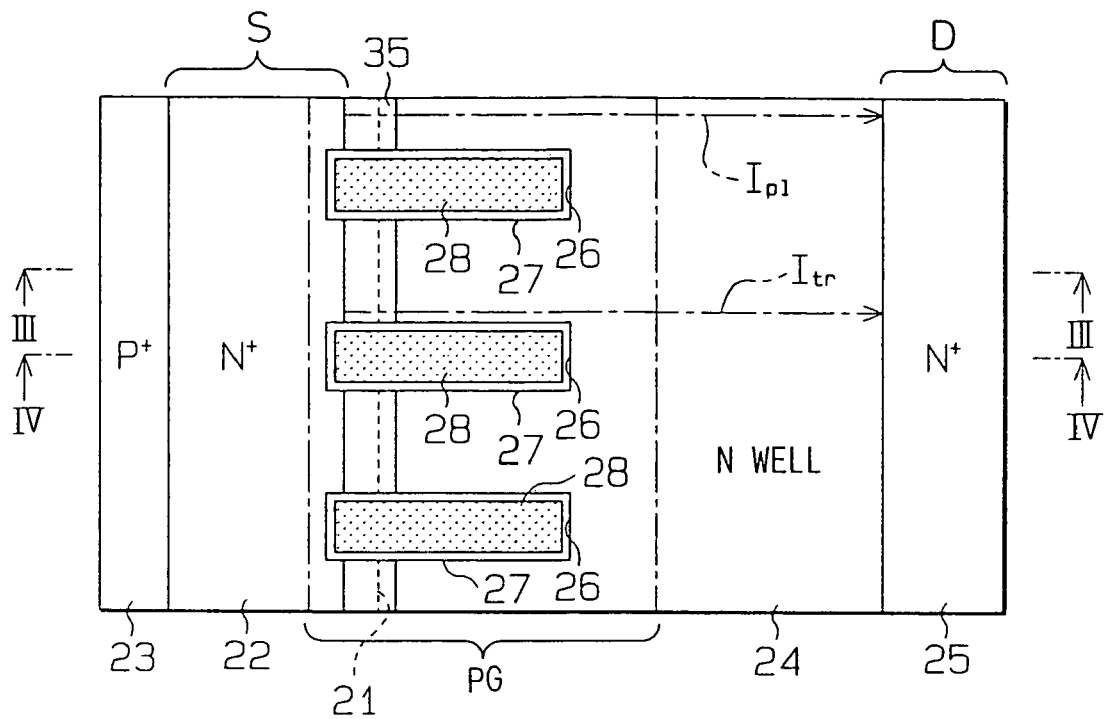
FIG. 2 is a plan view showing a lateral type power MOS transistor of the semiconductor device according to the first embodiment.
Figure 3:
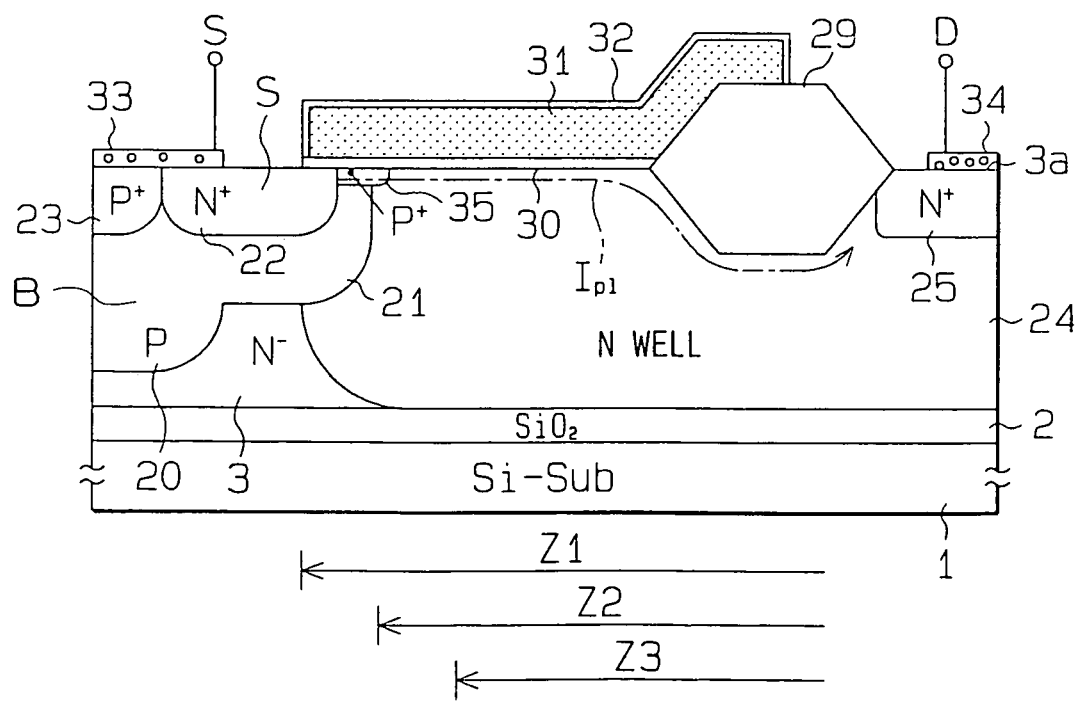
FIG. 3 is a cross sectional view showing the transistor of the semiconductor device taken along line III-III in FIG. 2.
Figure 4:
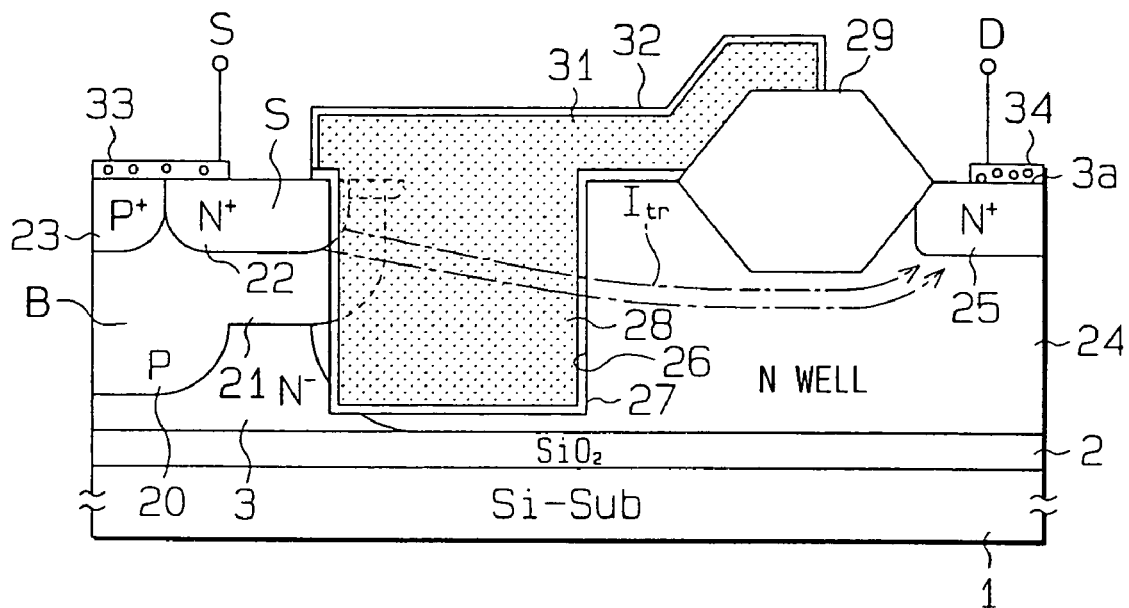
FIG. 4 is a cross sectional view showing the transistor of the semiconductor device taken along line IV-IV in FIG. 2.

The lateral type MOS transistor disposed in the power MOS portion 201 is described as follows. A Y portion in FIG. 1 is described in detail with reference to FIGS. 2-4. FIG. 2 is a plan view, FIG. 3 is a cross sectional view taken along line III-III in FIG. 2, and FIG. 4 is a vertical cross sectional view taken along line IV-IV in FIG. 2. Here, B represents base, S represents source, and D represents drain. The MOS transistor is formed in the N⁻ type silicon layer 3 as a semiconductor substrate. The top (3a) of the N⁻ type silicon layer 3 provides a principal plane 3a of the semiconductor substrate 3.

In FIG. 3, P type base regions 20, 21 are formed on the surface portion of the N⁻ type silicon layer 3 (i.e., the principal plane 3a of the substrate 3). The P type base region 21 is a well region. The P type base region 20 is formed deeper than the P type base region 21. A N⁺ type source region 22 is formed on the surface portion of the N⁻ type silicon layer 3 (i.e., the principal plane 3a of the substrate 3) in the P type base regions 20, 21 to be shallower than the P type base region 21. A P+ type base contact region 23 is formed on the surface portion of the N− type silicon layer 3 (i.e., the principal plane 3a of the substrate) in the P type base regions 20, 21. The P+ type base contact region 23 is shallower than the P type base region 21, and disposed adjacent to the N+ type source region 22.

A N type well region 24 is formed on the surface portion of the N− type silicon layer 3 (i.e., the principal plane 3a of the substrate 3) to contact the P type base region 21. A N+ type drain region 25 is formed on the surface portion of the N− type silicon layer 3 (i.e., the principal plane 3a of the substrate 3) in the N type well region 24. The N+ type drain region 25 is shallower than the N type well region 24, and separates from the P type base regions 20, 21.

As shown in FIG. 4, a trench 26 is dug from the principal plane 3a of the N− type silicon layer 3 (i.e., the substrate). The trench 26 has a planer construction in such a manner that the trench 26 penetrates the P type base regions 20, 21 disposed between the source region 22 and the drain region 25 in a direction from the N+ type source region 22 to the N+ type drain region 25, as shown in FIG. 2.

As shown in FIG. 4, a trench gate electrode 28 is formed inside of the trench 26 through a gate oxide film (i.e., a gate insulation film) 27. In detail, the trench gate electrode 28 is made of phosphorus doped poly silicon. This poly silicon material is embedded in the trench 26 to form the trench gate electrode 28.

A LOCOS oxide film 29 is formed on the N− type silicon layer 3 (i.e., the principal plane 3a of the substrate). The LOCOS oxide film 29 extends between the N+ type source region 22 and the N+ type drain region 25. As shown in FIG. 3, a planer gate electrode 31 is formed on the surface of the substrate (i.e., the principal plane 3a) through a gate oxide film (i.e., the gate insulation film) 30. The planer gate electrode 31 is also made of phosphorus doped poly silicon, similar to the trench gate electrode 28. A silicon oxide film 32 is formed on the surfaces of the planer and trench gate electrodes (i.e., the impurity doped poly silicon films) 28, 31.

A source electrode 33 and a drain electrode 34 are formed on the N− type silicon layer 3. The source electrode 33 electrically connects to both of the N+ type source region 22 and the P+ type base contact region 23. The drain electrode 34 electrically connects to the N+ type drain region 25.

When the lateral type power MOS transistor is off-state (i.e., a drain voltage is a predetermined positive voltage, a gate voltage is null volt, and a source voltage is null volt), the current does not flow.

On the other hand, when the lateral type power MOS transistor is on-state (i.e., the drain voltage is a predetermined positive voltage, the gate voltage is a predetermined positive voltage, and the source voltage is null volt), an inversion layer is formed in parts of the P type base regions 20, 21, respectively, the parts facing the trench gate electrode 28 and the planer gate electrode 31, respectively. In FIGS. 2 and 3, the current flows in a current path shown as Ipl. Specifically, the current flows from the N+ type source region 22 to the N+ type drain region 25 through the part (i.e., the inversion layer) of the P type base regions 20, 21 facing the planer gate electrode 31 and through the N type well region 24 as a drift region. In FIGS. 2 and 4, the current flows in a current path shown as Itr. Specifically, the current flows from the N+ type source region 22 to the N+ type drain region 25 through the part (i.e., the inversion layer) of the P type base regions 20, 21 facing the trench gate electrode 28 and through the N type well region 24 as a drift region. At this time, the current path Itr is formed in a deep portion disposed deeply from the surface. Therefore, the on-state resistance becomes small. Thus, in the transistor having a lateral type power device construction with using both of the trench gate TG and the planer gate PG, the current flows deeply and the channel density is improved, compared with the conventional planer gate lateral type power device, so that the on-state resistance is reduced.

Further, in this embodiment, as shown in FIG. 3, the P-type high-concentration impurity diffusion region (i.e., the P+ type region 3) is formed in the surface portion of the P type base regions 20, 21. In detail, the P+ type region 35 is formed in a part of the channel region in the P type base regions 20, 21, the part facing the planer gate electrode 31. Thus, the region (35) having high impurity concentration is formed in the part of the base region.

Next, a method for manufacturing the device is described as follows with reference to FIGS. 5-9.

Figure 5:
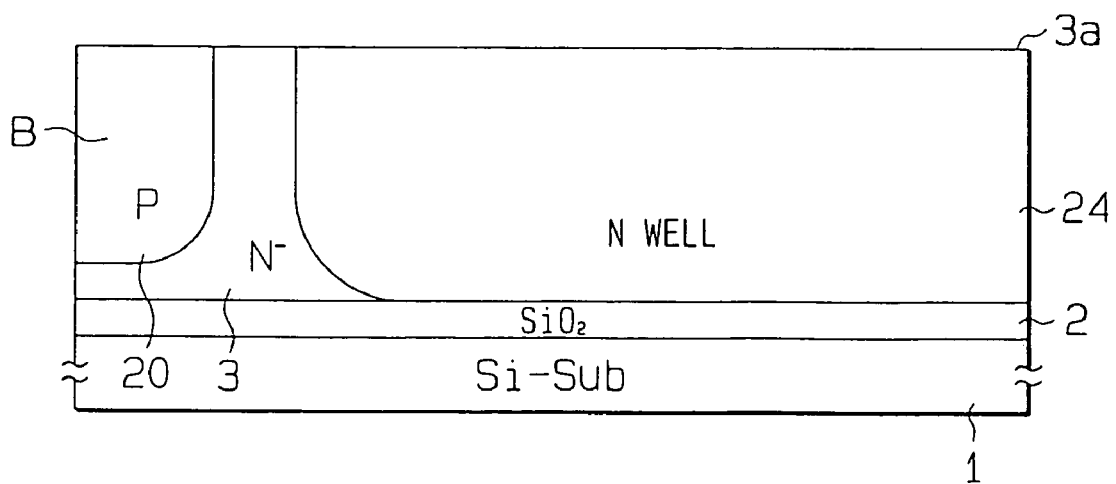
FIG. 5 is a cross sectional view explaining a method for manufacturing the transistor of the semiconductor device according to the first embodiment.

At first, as shown in FIG. 5, the SOI substrate is prepared. Specifically, the N− type silicon layer 3 is formed on the silicon substrate 1 through the insulation film (i.e., the silicon oxide film) 2 so that the SOI substrate is prepared. The trench 4 (See FIG. 1) is formed in the N− type silicon layer 3. Further, the silicon oxide film 5 is formed on the sidewall of the trench 4. Further, the poly silicon film 6 is filled in the trench 4 through the silicon oxide film 5. Thus, multiple device-to-be-formed islands are provided by the trench 4. Successively, in the island for providing the lateral type power MOS transistor (i.e., the trench gate type LDMOS), the P type base region 20 and the N type well region 24 are formed, as shown in FIG. 5.

Figure 6A:
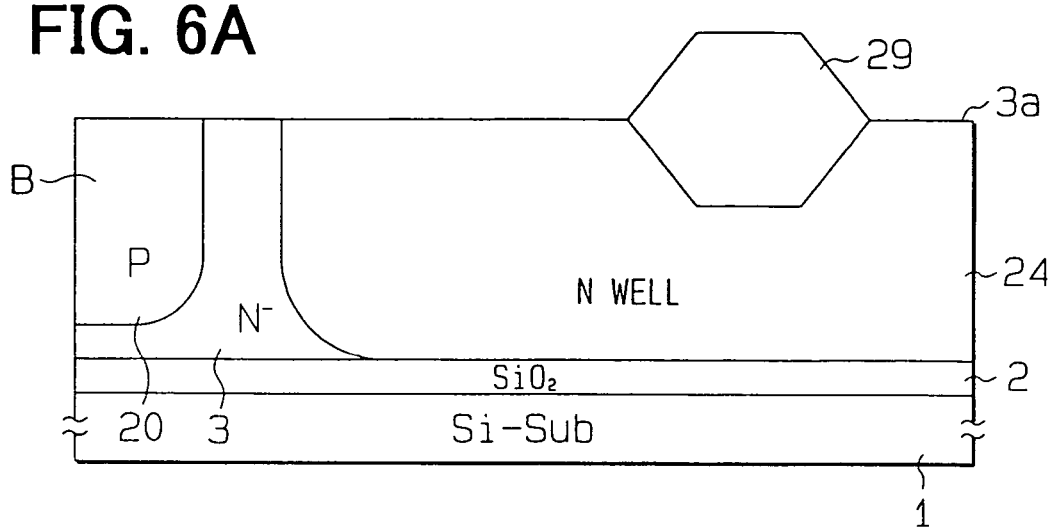
FIGS. 6A-6C are cross sectional views explaining the method for manufacturing the transistor of the semiconductor device according to the first embodiment.
Figure 6B:
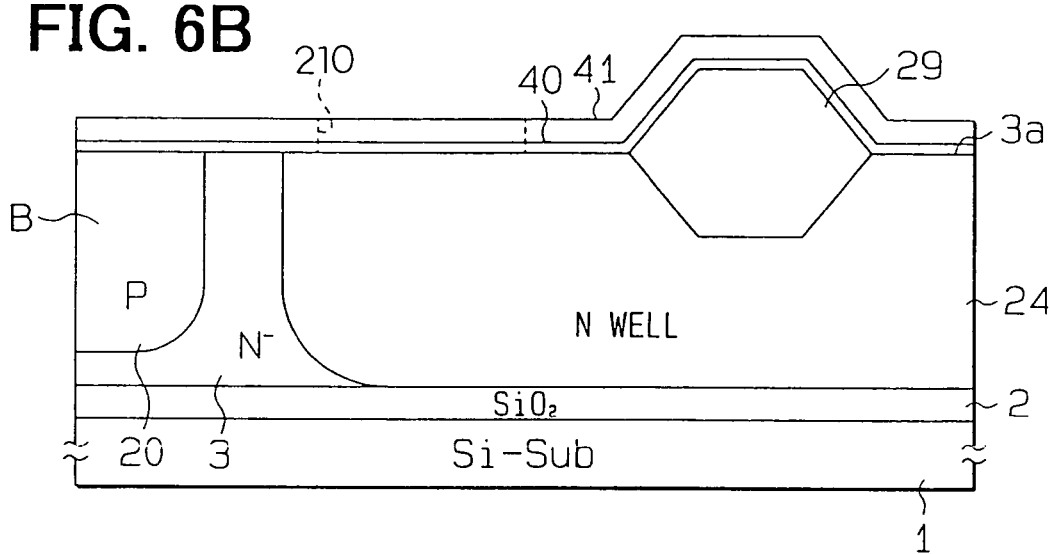
Figure 6C:
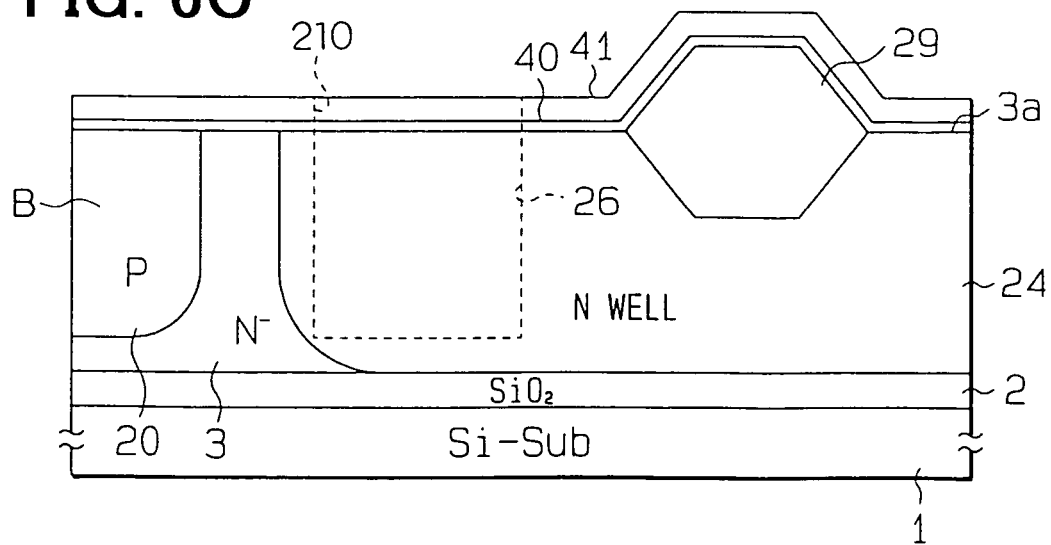

Further, as shown in FIG. 6A, in the island for providing the lateral type power MOS transistor (i.e., the trench gate type LDMOS), the LOCOS oxide film 29 is formed. Then, as shown in FIG. 6B, oxide films 40, 41 are laminated, and an opening 210 of the oxides films 40, 41 is formed by using a photo resist, the opening 210 corresponding to the trench-to-be-formed region. The thickness of the oxide film 40 is about 425 Angstrom, and the thickness of the oxide film 41 is about 5000 Angstrom. Then, as shown in FIG. 6C, the trench 26 is formed by etching the N− type silicon layer 3 from the opening 210 of the oxide films 40, 41. Further, reaction products are removed by a wet etching method.

Thus, the trench 26 is formed in the N− type silicon layer 3 (i.e., the principal plane 3a of the substrate).

Figure 7A:
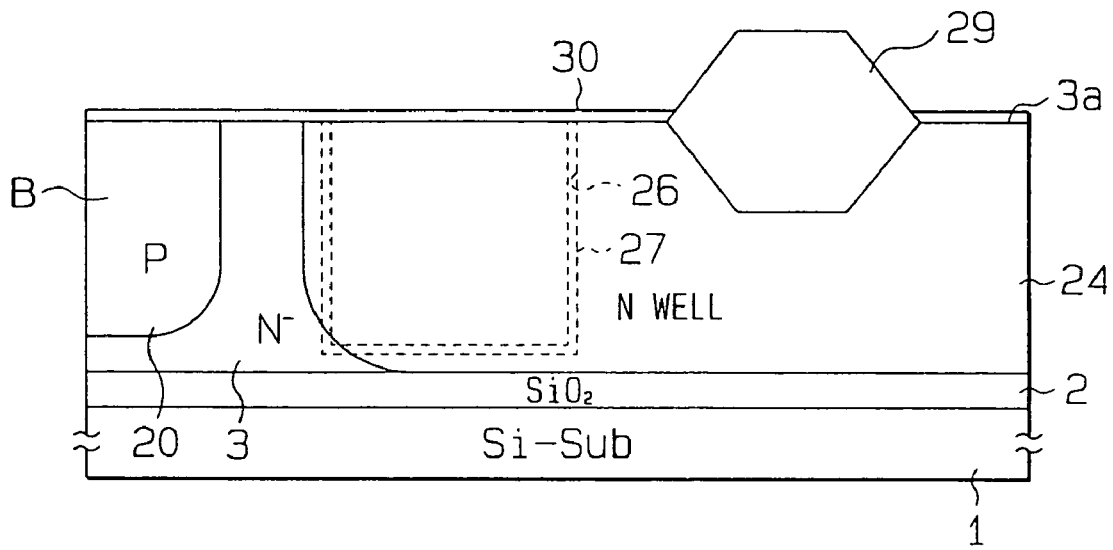
FIGS. 7A and 7B are cross sectional views explaining the method for manufacturing the transistor of the semiconductor device according to the first embodiment.
Figure 7B:
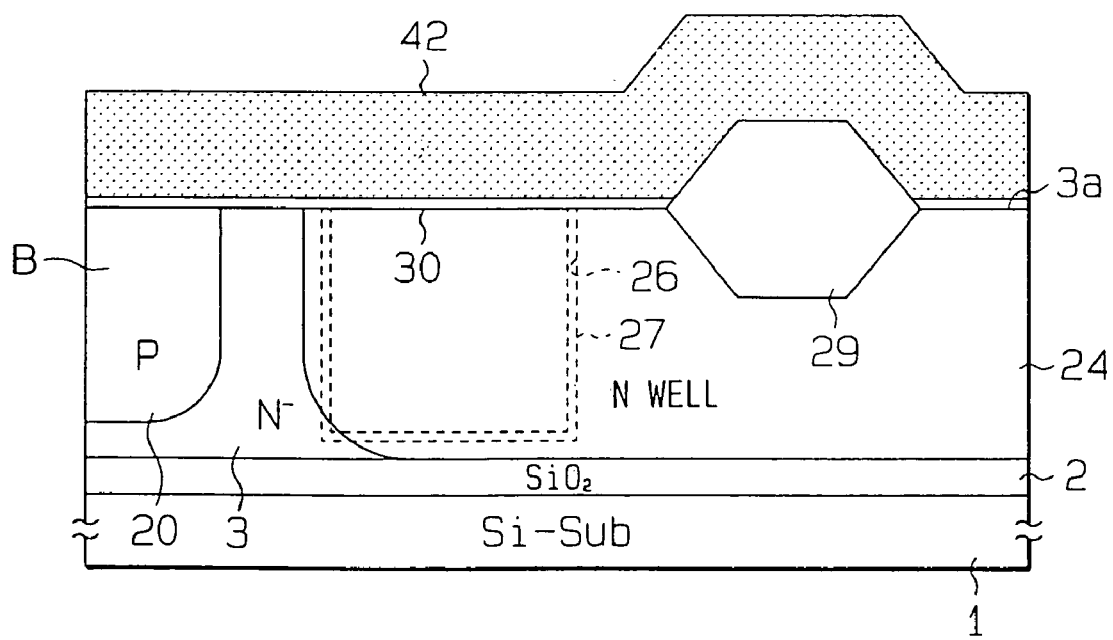

After that, as shown in FIG. 7A, the gate oxide films 27, 30 are formed on the N− type silicon layer 3 (i.e., the principal plane 3a of the substrate) including the inner wall of the trench 26 by a thermal oxidation method. The thickness of each gate oxide film 27, 30 is about 500 Angstrom. Further, as shown in FIG. 7B, the impurity doped poly silicon film 42 is deposited about 9000 Angstrom so that the trench 26 is embedded with the impurity doped poly silicon film 42. Then, a part of the impurity doped poly silicon film 42 disposed on the substrate is etched back so that the thickness of the impurity doped poly silicon film 42 becomes about 3700 Å. Then, reaction products are removed, and the substrate is rinsed out.

Figure 8A:
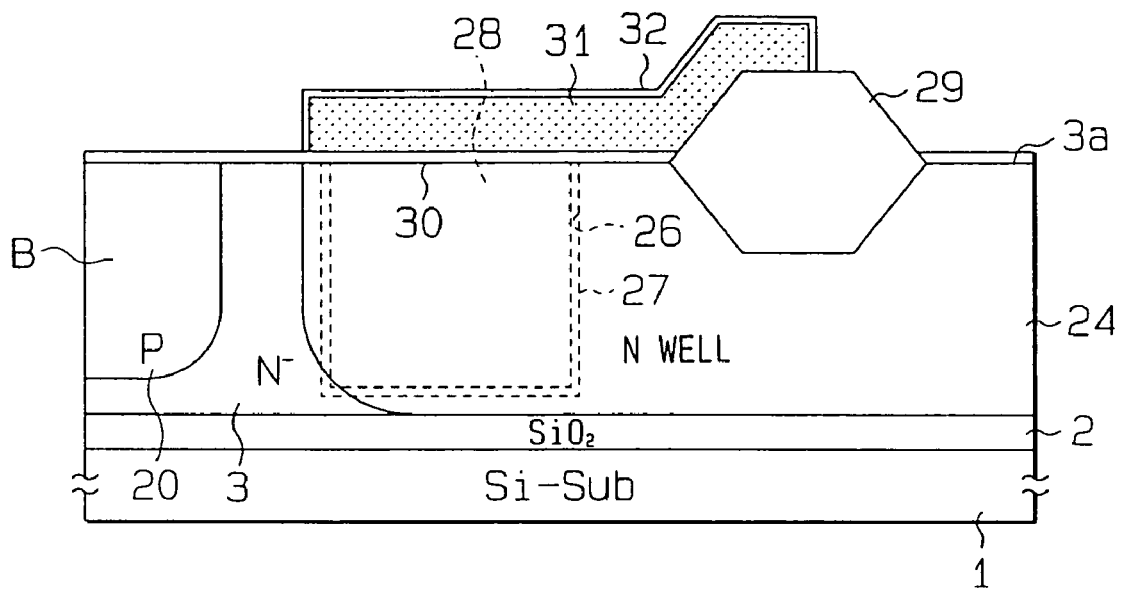
FIGS. 8A and 8B are cross sectional views explaining the method for manufacturing the transistor of the semiconductor device according to the first embodiment.

Successively, the impurity doped poly silicon film 42 disposed on the substrate is patterned in a photolithography process and a dry-etching process so that the planer gate electrode 31 is formed, as shown in FIG. 8A. Further, reaction products are removed, and the substrate is rinsed out. Then, the oxide film 32 having the thickness of 600 Angstrom is formed on the surface of the impurity doped poly silicon film (31). Then, the substrate is annealed at 1170° C. during 30 minutes so that damage of the inner wall of the trench is recovered.

Thus, the trench gate electrode 28 is formed inside of the trench 26 through the gate oxide film 27. The planer gate electrode 31 is formed on the principal plane 3a through the gate oxide film 30.

Figure 8B:
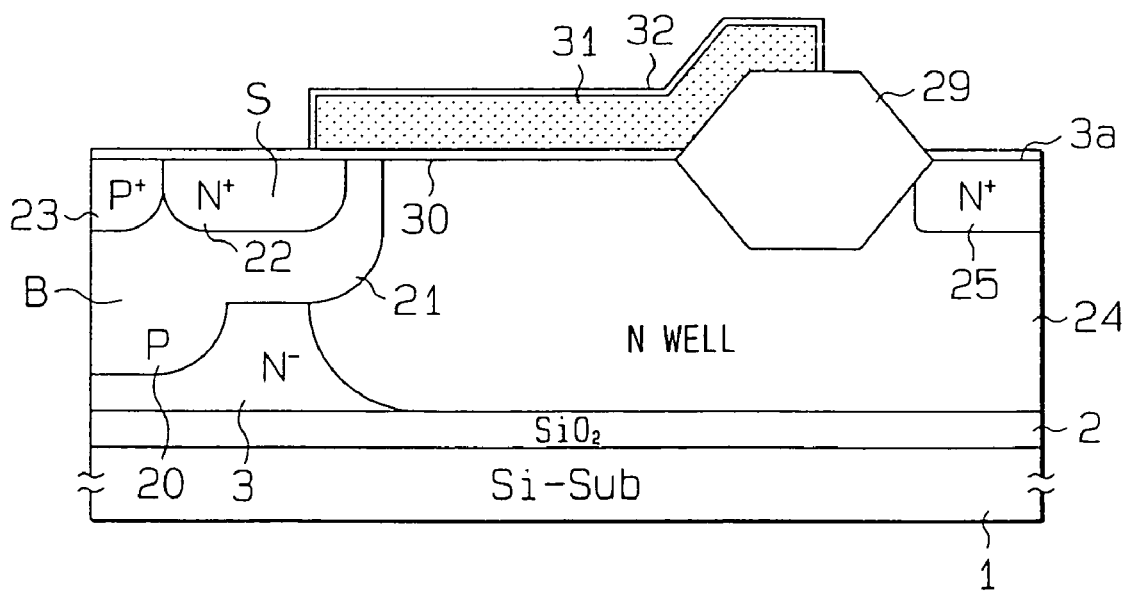

Successively, as shown in FIG. 8B, the P type base region (i.e., well) 21 is formed, and the N$^+$ type source region 22 and the N$^+$ type drain region 25 are formed by an ion implantation method with using the planer gate electrode 31 as a mask (i.e., the N$^+$ type source region 22 is formed by a self-aligning method). Then, the P$^+$ type base contact region 23 is formed.

Then, as shown in FIG. 9, the impurity concentration of the part of the base region 21 facing the planer gate electrode 31, the part to be the channel region, is increased by implanting ions of a P type element at a slant (i.e., the P$^+$ type region 35 is formed). Here, arrows ION represent a slanting ion implantation. After that, a contact is formed, and a wiring is performed. As a result, the lateral type power MOS transistor (the trench gate type LDMOS) shown in FIGS. 2-4 is completed.

By using the poly silicon self-aligning method, the N$^+$ type source region 11 and the N$^+$ type drain region 12 in the logic portion 200 (i.e., the CMOS) shown in FIG. 1 are formed together with the N$^+$ type source region 22 and the N$^+$ type drain region 25 in the power MOS portion 201 at the same time (i.e., formed in a common process). Thus, the method can be simplified. Further, since the source diffusion layer (i.e., the N type region) is formed by the self-aligning method, a variation of the diffusion layer in the lateral direction becomes small. Therefore, it is preferable for operating uniformly. Further, it is preferable for preventing the current path from deviating, for suppressing increase of the on-state resistance and for suppressing decrease of the ESD (i.e., electrostatic discharge) withstand voltage.

Further, in this embodiment applied to the semiconductor IC having the lateral type power device with using both of trench gate TG and planer gate PG, as shown in FIGS. 2 and 3, the P$^+$ type region 35 is formed in a part of each base region 20, 21, the part to be the channel region and facing the planer gate electrode 31. Thus, a relative relationship between the threshold voltage Vt in the vertical direction and the threshold voltage Vt in the lateral direction is controlled so that the threshold operation (i.e., Vt operation) by the trench gate TG becomes lower than that by the planer gate PG. Therefore, the current flows much deeply. As a result, the IC having a low on-state resistance and a high ESD withstand voltage is manufactured. Further the IC (i.e., integrated circuit) having excellent quality is manufactured at a low cost.

Specifically, in the sample IC, as shown in FIGS. 38A-38C, the source diffusion layer (i.e., the N$^+$ type region) is formed by the self-aligning method. Therefore, the concentration of the diffusion layer defining the Vt in the lateral direction is different from that defining the Vt in the vertical direction, so that the concentration of the connecting portion VC in the vertical direction is higher than that LC in the lateral direction. Thus, the Vt in the vertical direction is higher than that in the lateral direction. Accordingly, the trench gate TG prevents the current from flowing deeply, so that the reduction of the on-state resistance is not obtained. Further, when the current flows through the surface portion only, i.e., when the current path is the lateral direction only, the ESD withstand voltage may be also reduced.

On the other hand, in this embodiment, the concentration of the utmost surface portion is increased by the slanting ion implantation method (with a P type ion dopant) with using the edge of the poly silicon gate electrode as a mask, as shown in FIGS. 10A-10C. FIGS. 10B and 10C are graphs showing a relationship between a position on line L1 or L2 and a concentration. In FIGS. 10B and 10C, the horizontal axis represents a position on the line L1 or L2, and the vertical axis represents the concentration. Thus, the concentration of the connecting portion VC in the vertical direction becomes about $5.0 \times 10^{16}/cm^3$, and the concentration of the connecting portion LC in the lateral direction becomes about $1.0 \times 10^{17}/cm^3$, so that the Vt operation in the trench gate TG is lower than that in the planer gate PG. As a result, the current flows much deeply, and the channel density is improved. Thus, the on-state resistance is reduced. Further, since the current path becomes deeper, the heat generation region becomes wider, so that the high ESD withstand voltage can be obtained.

To confirm the effects of the invention, an experiment is performed. The experiment is described as follows with respect to FIG. 11.

Figure 11:
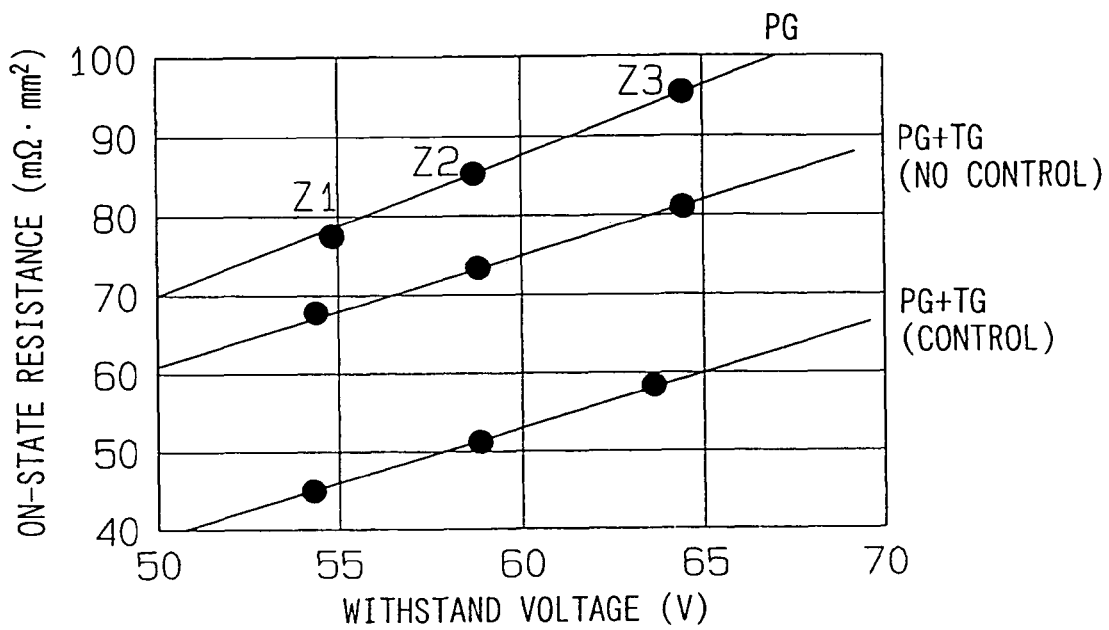
FIG. 11 is a graph showing a measurement result of an on-state resistance versus a withstand voltage, according to the first embodiment.

In FIG. 11, the horizontal axis represents the withstand voltage, and the vertical axis represents the on-state resistance. In a comparison, a device (i.e., PG) having a planer gate PG only and a device (i.e., PG+TG) having both of a planer gate PG and a trench gate TG are tested. Further, in the device (i.e., PG+TG) having both of the planer gate PG and the trench gate TG, a case (i.e., CONTROL) where a relative relationship between the threshold voltage Vt in the vertical direction and the threshold Vt in the lateral direction is controlled is compared with another case (i.e., NO CONTROL) where the relative relationship is not controlled. Furthermore, a device (Z1) having the N type well region 24 expanding in a source side as shown in FIG. 3 represents as Z1. Other devices (i.e., Z2, Z3) having the N type well region 24 expanding narrower than the device Z1 represent Z2 and Z3, respectively, so that the devices Z2, Z3 are compared with the device Z1.

As shown in FIG. 11, by changing from the device (i.e., PG) having the planer gate PG only to the device (PG+TG) having both of the planer gate PG and the trench gate TG, the reduction effect of the on-state resistance is obtained. Further, in the device (i.e., PG+TG) having both of the planer gate PG and the trench gate TG, the reduction effect of the on-state resistance in a case (i.e., CONTROL) where the relative relationship between the threshold voltage Vt in the vertical direction and the threshold voltage Vt in the lateral direction is controlled is larger than that in a case (i.e., NO CONTROL) where the relative relationship is not controlled.

As described above, the present embodiment has the following characteristics.

(A) In the construction, as shown in FIGS. 2 and 3, the P$^+$ type region 35 is formed in the portion of the base region 20, 21 to be a channel region, which faces the planer gate electrode 31. Thus, the impurity concentration of the channel region facing the trench gate electrode 28 and the impurity concentration of the channel region facing the planer gate electrode 31 have the relationship such that the impurity concentration of the channel region facing the planer gate electrode 31 becomes higher. Accordingly, the threshold voltage Vt in a case where the current flows through the channel region facing the trench gate electrode 28 and the threshold voltage Vt in a case where the current flows through the channel region facing the planer gate electrode 31 have the relationship such that the threshold voltage Vt in a case where the current flows through the channel region facing the planer gate electrode 31 becomes larger. As a result, the current flows through the trench gate TG in the vertical direction much easier compared with the conventional construction, so that the reduction of the on-state resistance is obtained.

(B) To provide the manufacturing method of the above device, as shown in FIG. 9, the method includes a process for increasing the impurity concentration at the portion of the P type base region 21 to be a channel region facing the planer gate electrode 31 by implanting ions of the P type element at a slant. Thus, the construction described in (A) is obtained.

Second Embodiment

Next, a second embodiment of the present invention is explained as follows.

In the first embodiment, the concentration at the utmost surface portion is increased by the slanting ion implantation method (with the P type ion dopant) with using the poly silicon gate electrode as a mask so that the relative relationship between the threshold voltage Vt in the vertical direction and the threshold voltage Vt in the lateral direction is controlled. On the other hand, in the second embodiment, the channel region becomes the $P^+$ type region by the following manner.

As shown in FIGS. 6A-6C, the trench 26 is formed in the $N^-$ type silicon layer 3 (i.e., the principal plane 3a of the substrate). As shown in FIG. 7A, the gate oxide films 27, 30 are formed on the $N^-$ type silicon layer 3 (i.e., the principal plane 3a of the substrate) including the inner wall of the trench 26. In a process shown in FIG. 7B, the trench gate electrode 28 is formed inside of the trench 26 through the gate oxide film 27. Specifically, in FIG. 8A, the impurity doped poly silicon film (31) remains on the substrate. However, in this embodiment, the impurity doped poly silicon film (31) does not remain (i.e., the planer gate electrode disposed on the principal plane 3a is not formed yet).

Figure 12:
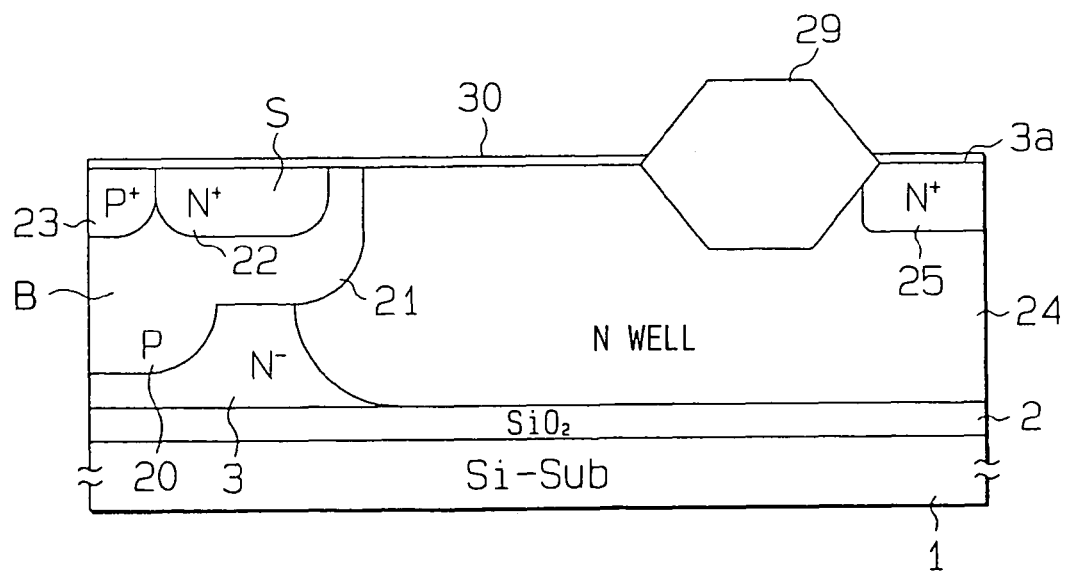
FIG. 12 is a cross sectional view explaining a method for manufacturing a lateral type power MOS transistor of a semiconductor device according to a second embodiment of the present invention.
Figure 13A:
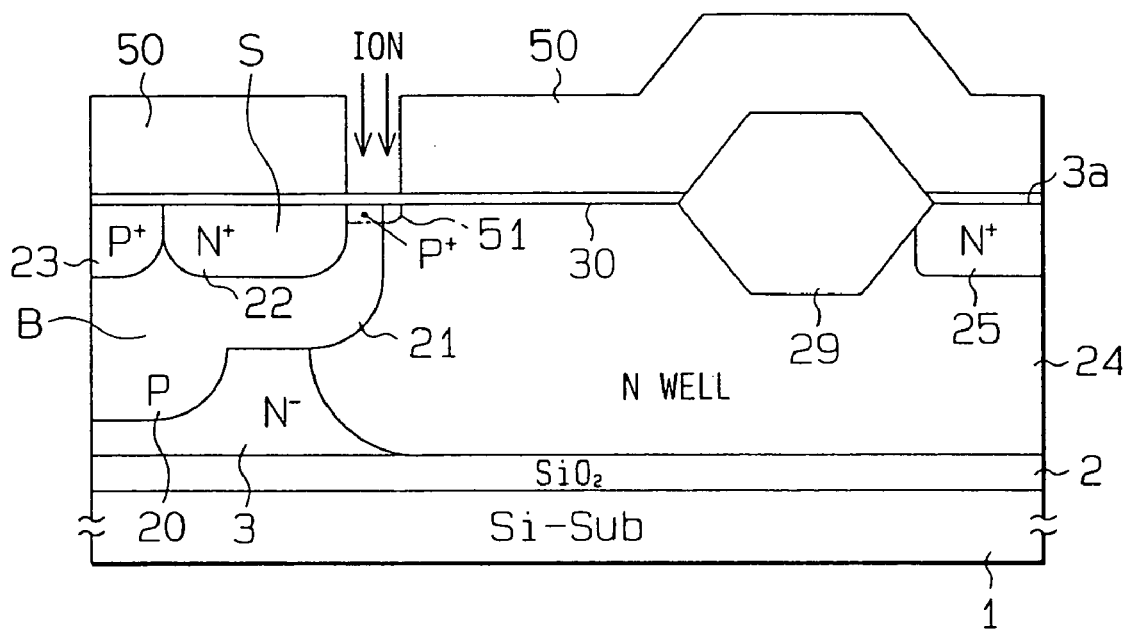
FIGS. 13A and 13B are cross sectional views explaining the method for manufacturing the transistor of the semiconductor device according to the second embodiment.

From the above state, i.e., without forming the planer gate electrode, as shown in FIG. 12, the P type base region 21, the $N^+$ type source region 22, the $N^+$ type drain region 25 and the $P^+$ type base contact region 23 are formed by the ion implantation method with using a resist mask. Then, as shown in FIG. 13A, a mask 50 is formed on the substrate. The impurity concentration at the portion of the P type base region 21 to be a channel region of the surface portion of the $N^-$ type silicon layer 3 (i.e., the principal plane 3a of the substrate) is increased by implanting ions (i.e., a low energy ion implantation ION) of the P type element at a low energy (i.e., a $P^+$ type region 51 is formed).

Figure 13B:
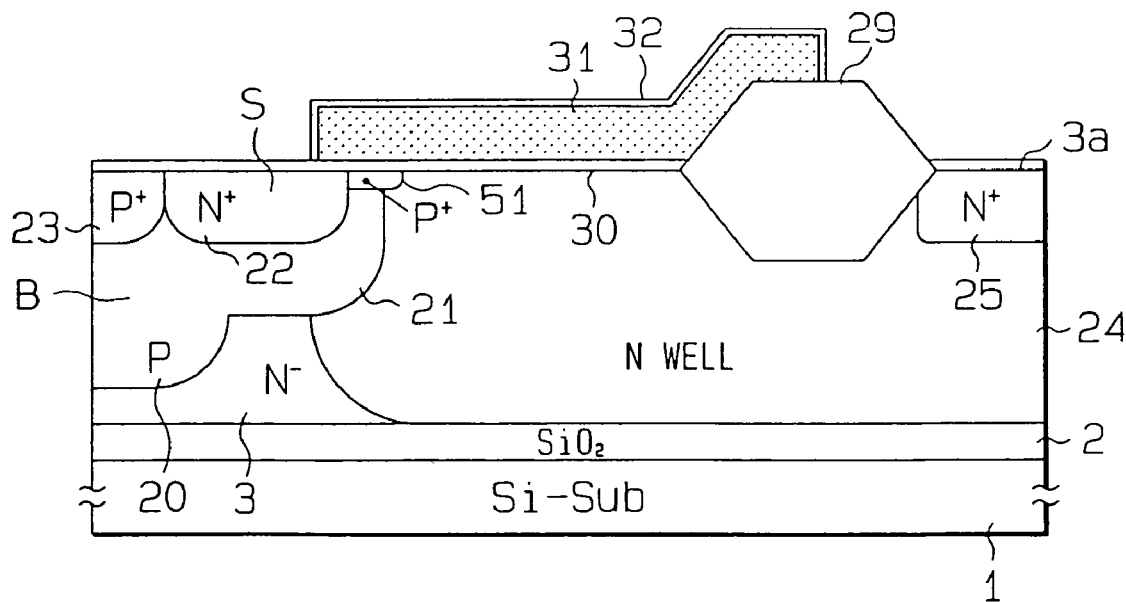

Further, as shown in FIG. 13B, the impurity doped poly silicon film is deposited on the substrate with about 500 Angstrom. The impurity doped poly silicon film is patterned in a photolithography process and an etching process so that the planer gate electrode 31 is formed. Then, the oxide film 32 is formed on the surface of the impurity doped poly silicon film (31). Thus, the planer gate electrode 31 is formed on the $N^-$ type silicon layer 3 (i.e., the principal plane 3a of the substrate) through the gate oxide film 30.

After that, a contact is formed, and a wiring is performed.

Thus, in the semiconductor device, the current in a vertical direction flows by a trench gate easily so that an on-state resistance is reduced.

Third Embodiment

Next, a third embodiment of the present invention is explained as follows.

Figure 14:
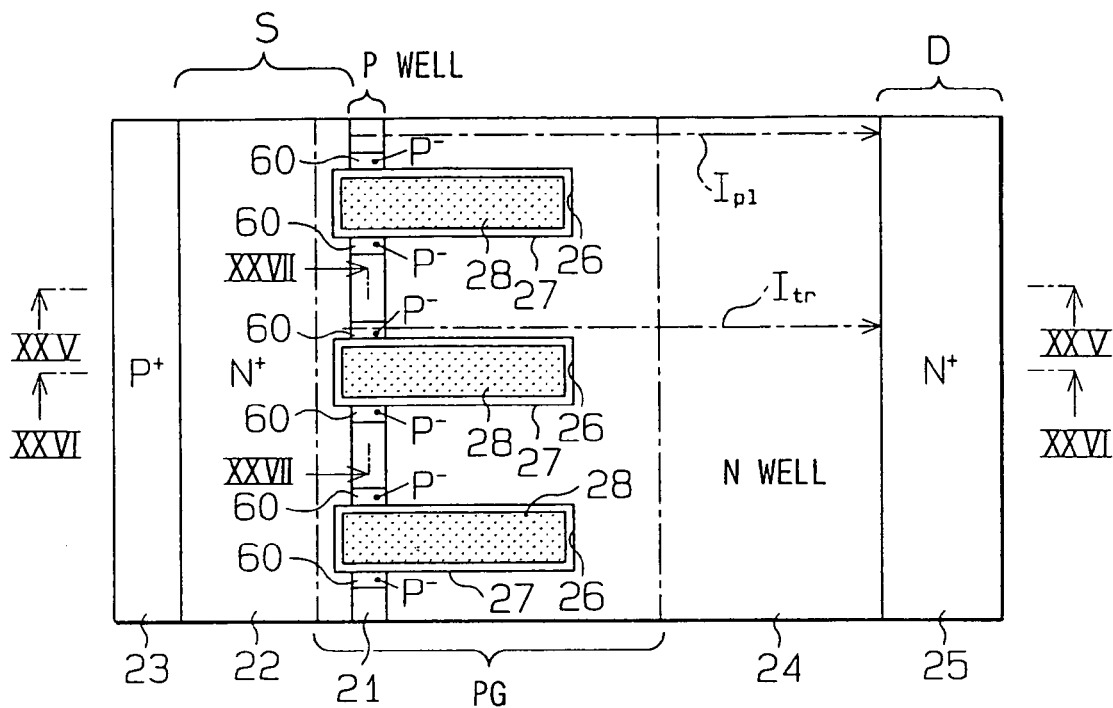
FIG. 14 is a plan view showing a lateral type power MOS transistor of a semiconductor device according to a third embodiment of the present invention.
Figure 15:
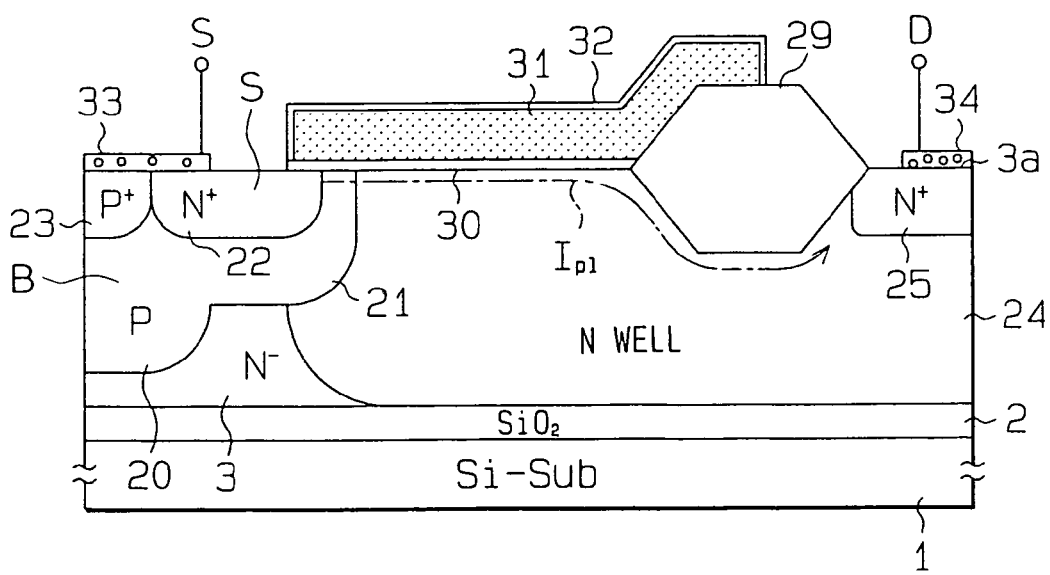
FIG. 15 is a cross sectional view showing the transistor of the semiconductor device taken along line XV-XV in FIG. 14.
Figure 16:
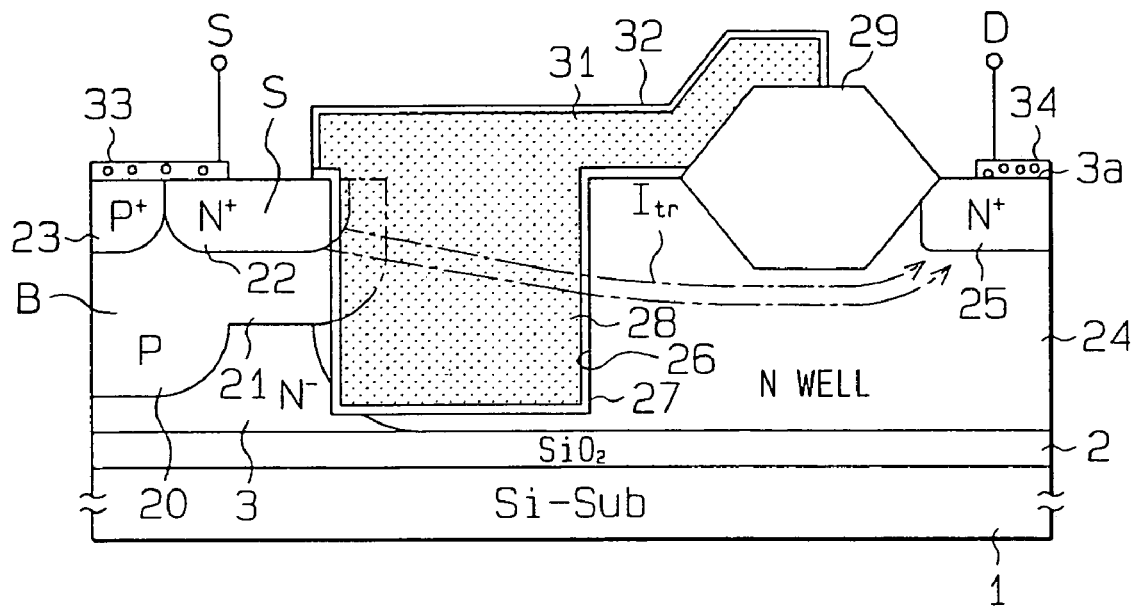
FIG. 16 is a cross sectional view showing the transistor of the semiconductor device taken along line XVI-XVI in FIG. 14.
Figure 17:
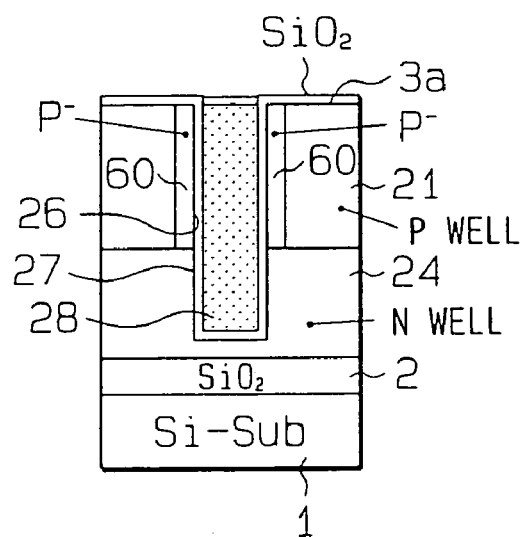
FIG. 17 is a cross sectional view showing the transistor of the semiconductor device taken along line XVII-XVII in FIG. 14.

FIG. 14 is a plan view showing a lateral type MOS transistor according to the third embodiment. FIG. 15 is a cross sectional view showing the transistor taken along line XV-XV in FIG. 14. FIG. 16 is a cross sectional view showing the transistor taken along line XVI-XVI in FIG. 14. FIG. 17 is a vertical cross sectional view showing the transistor taken along line XVII-XVII in FIG. 14.

As shown in FIGS. 14 and 17, a low concentration impurity diffusion region (i.e., a $P^-$ type region 60) having P type conductivity is formed on the inner wall of the trench 26 disposed on the surface portion of the P type base region (i.e., the P type well region) 21. Specifically, the $P^-$ type region 60 is formed on the portion of the P type base region 20, 21 to be a channel region facing the trench gate electrode 28. Thus, the low impurity concentration region (60) is formed on a part of the base region. Therefore, the relative relationship between the threshold Vt in the vertical direction and the threshold voltage Vt in the lateral direction is controlled, so that the threshold operation (i.e., the Vt operation) by the trench gate TG becomes lower than that by the planer gate PG. Thus, the current flows more deeply.

Next, the manufacturing method is explained.

Figure 18A:
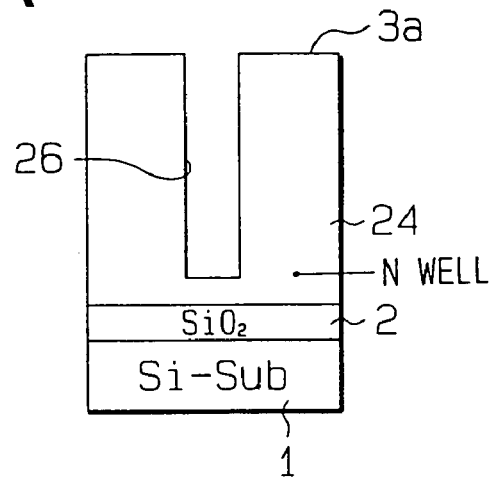
FIGS. 18A-18C are cross sectional views explaining a method for manufacturing the transistor of the semiconductor device according to the third embodiment.
Figure 18B:
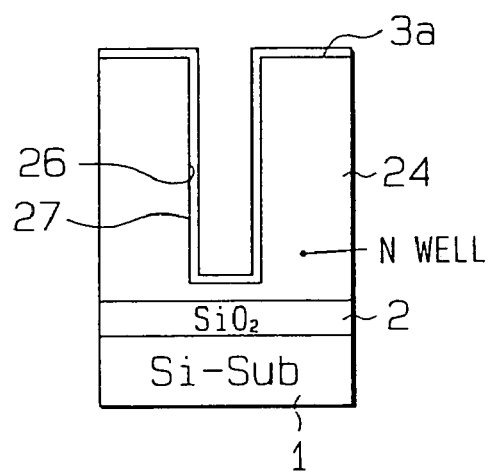
Figure 18C:
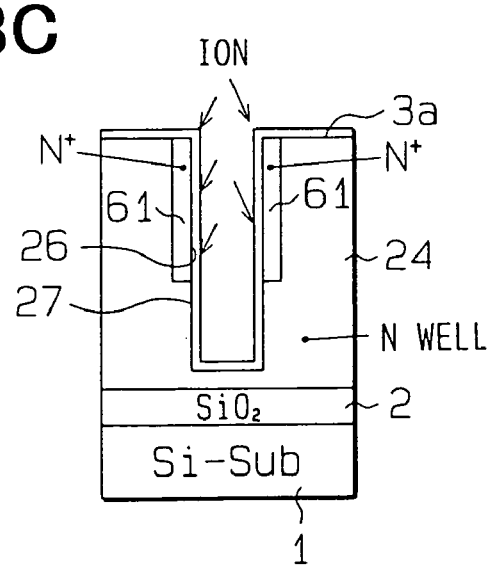

At first, in the island for providing the lateral type power MOS transistor (i.e., the trench gate type LDMOS transistor), the P type base region 20, the N type well region 24 and the LOCOS oxide film 29 shown in FIG. 15 are formed. Then, as shown in FIG. 18A, the $N^-$ type silicon layer 3 is etched, so that the trench 26 is formed in the $N^-$ type silicon layer 3 (i.e., the principal plane 3a of the substrate). After that, as shown in FIG. 18B, the gate oxide films 27, 30 (See FIG. 15) are formed on the $N^-$ type silicon layer (i.e., the substrate) 3 including the inner wall of the trench 26 by the thermal oxidation method. Further, as shown in FIG. 18C, a $N^+$ type region 61 is formed on the inner wall of the trench 26 disposed on the portion to be a channel region of the surface portion by implanting ions (i.e., ION) of a N type ionization element at a slant.

Figure 19A:
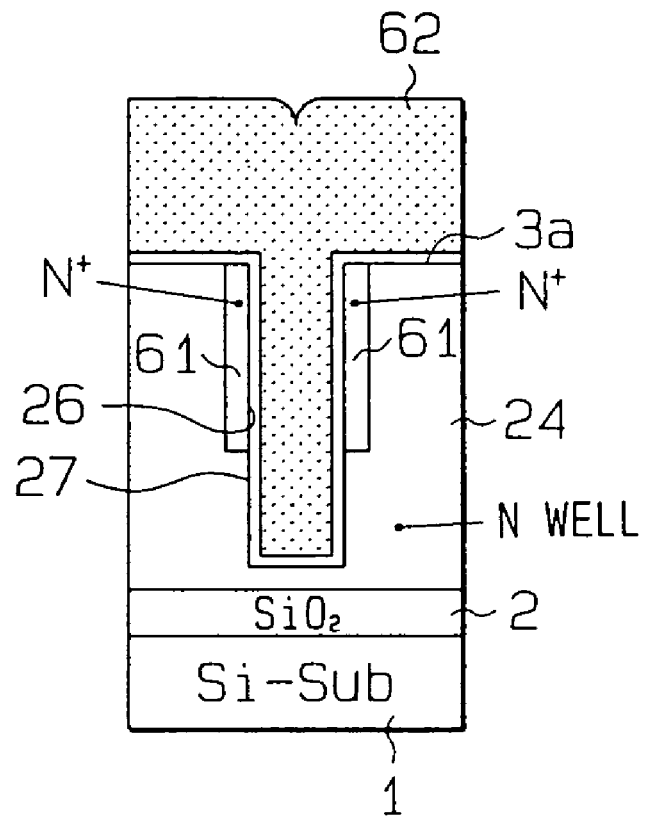
FIGS. 19A and 19B are cross sectional views explaining the method for manufacturing the transistor of the semiconductor device according to the third embodiment.
Figure 19B:
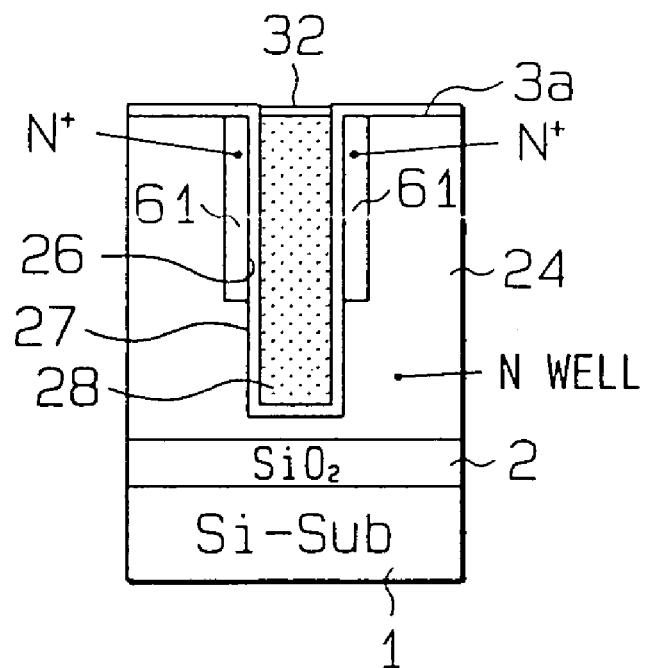

As shown in FIG. 19A, an impurity doped poly silicon film 62 is deposited so that an impurity doped poly silicon film 62 is embedded in the trench 26. Then, as shown in FIG. 19B, the impurity doped poly silicon film 62 disposed on the substrate is etched back so that the film 62 has a predetermined thickness. Then, the impurity doped poly silicon film 62 is patterned so that the planer gate electrode 31 is provided (See FIG. 15). Further, the oxide film 32 is formed on the surface. Thus, the trench gate electrode 28 is formed inside of the trench 26 through the gate oxide film 27, and the planer gate electrode 31 is formed on the principal plane 3a through the gate oxide film 30.

Successively, as shown in FIG. 17, the $N^+$ type source region 22 is formed by the ion implantation method with using the planer gate electrode as a mask together with forming the P type base region (i.e., the P type well region) 21. When the P type base region (i.e., the P type well) 21 is formed, the $P^-$ type region shown in FIGS. 14 and 17 is formed. Specifically, the P type region (i.e., the P type base region 21) is formed so as to overlap on the $N^+$ type region 61 so that the bedded $N^+$ type region 61 becomes the $P^-$ type region 60.

Thus, the $N^+$ type region 61 is formed on the inner wall of the trench disposed on the surface portion by a high acceleration ion implantation method. When the P type base region (i.e., the P type well) 21 is formed after that, the concentration at a portion for defining the threshold voltage Vt in the vertical direction is decreased.

As described above, the present embodiment has the following characteristics.

(A) In the construction, the $P^-$ type region 60 is formed on a portion of the base region 20, 21 to be a channel region facing the trench gate electrode 28, as shown in FIGS. 14 and 17. Thus, the impurity concentration of the channel region facing the trench gate electrode 28 and the impurity concentration of the channel region facing the planer gate electrode 31 have the relationship such that the impurity concentration of the channel region facing the trench gate electrode 28 becomes lower. Therefore, the threshold voltage Vt in a case where the current flows through the channel region facing the trench gate electrode 28 and the threshold voltage Vt in a case where the current flows through the channel region facing the planer gate electrode 31 have the relationship such that the threshold voltage Vt in a case where the current flows through the channel region facing the trench gate electrode 28 becomes lower. As a result, the current flows through the trench gate TG in the vertical direction much easier compared with the conventional construction, so that the reduction of the on-state resistance is obtained.

(B) To provide the manufacturing method of the above device, as shown in FIG. 18C, ions of the N type element is implanted on the inner wall of the trench 26 disposed on a portion to be a channel region of the surface portion. Then, the trench gate electrode 28 and the planer gate electrode 31 are formed. After that, the P type base region 21 is formed, as shown in FIG. 17.

Thus, the construction described in (A) is obtained.

Fourth Embodiment

Next, a fourth embodiment of the present invention is explained as follows.

In the third embodiment, the P$^-$ type region 60 is formed on the inner wall of the trench 26 disposed on a portion to be a channel region by implanting ions (i.e., ION) of the N type element before the P type base region 21 is formed. On the other hand, in the present embodiment, the P$^-$ type region 60 is formed as follows.

A film heavily doped with a phosphorous as the N type impurity element is prepared as the poly silicon film 42 for being embedded in the trench gate TG shown in FIG. 7B. Then, in a thermal treatment process after the preparation, the phosphorous doped in the poly silicon film is diffused in a silicon substrate side through the gate oxide film (i.e., the silicon oxide film) 27 so that the P-type region 60 shown in FIG. 14 is formed. Thus, the surface concentration of the channel at the trench gate electrode is decreased.

As described above, after the trench 26 and the gate oxide films 27, 30 are formed, the trench gate electrode 28 doped with the phosphorous as the first conductive type element is formed inside of the trench 26 through the gate oxide film 27, together with forming the planer gate electrode 31 on the principal plane 3a through the gate oxide film 30. Further, the N$^+$ type source region 22 is formed by implanting ions with using the planer gate electrode 31 as a mask, together with forming the P type base region. Thus, the construction described in (B) of the third embodiment is obtained by diffusing the doped phosphorous in the substrate side.

Thus, in the semiconductor device, the current in a vertical direction flows by a trench gate easily so that an on-state resistance is reduced.

Fifth Embodiment

Next, a fifth embodiment of the present invention is explained as follows.

Figure 20:
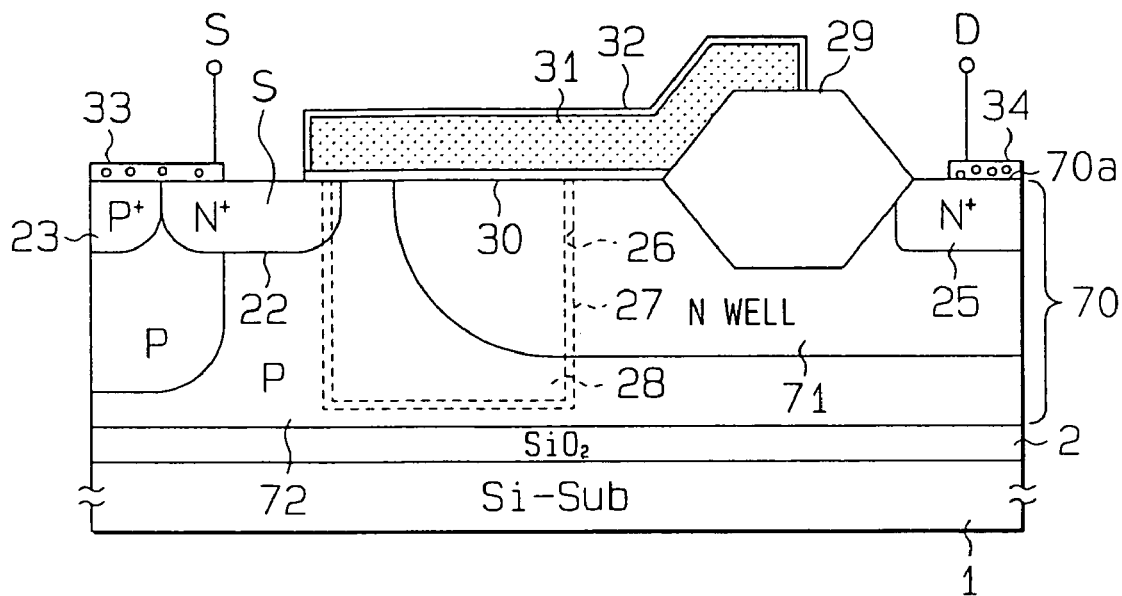
FIG. 20 is a cross sectional view showing a lateral type power MOS transistor of a semiconductor device according to a fifth embodiment of the present invention.

FIG. 20 is a cross sectional view showing a lateral type MOS transistor according to the present embodiment.

In the present embodiment, a P type silicon layer (a P type substrate) 70 is used. A N type well region 71 is formed in a P type silicon layer (i.e., the P type substrate) 70 so that a base region 72 is provided by the P type silicon layer (i.e., the P type substrate). Specifically, the base region 72 is composed of a bulk portion except for the N type well region 71 to be a drift region disposed on the surface portion of the P type silicon layer (i.e., the principal plane 70a of the substrate).

Further, the N$^+$ type source region 22 is formed on the surface portion of the P type silicon layer 70 (i.e., the principal plane 70a of the substrate) disposed in the base region 72. The N$^+$ type drain region 25 is formed on the surface portion of the P type silicon layer (i.e., the principal plane 70a of the substrate) disposed in the N type well region 71 to be shallower than the N type well region 71. The trench 26 is dug from the principal plane (i.e., the principal plane of the substrate) 70a of the P type silicon layer so that a planer construction of the trench 26 is such that the trench 26 penetrates the base region 72 disposed between the source region 22 and the drain region 25 in a direction from the N$^+$ type source region 22 to the N$^+$ type drain region 25. The trench gate electrode 28 is formed inside the trench 26 through the gate oxide film 27, together with forming the planer gate electrode 31 on the principal plane 70a through the gate oxide film 30.

In the above construction, the impurity concentration of the channel region facing the trench gate electrode 28 and the impurity concentration of the channel region facing the planer gate electrode 31 have the relationship such that both of them equal. Thus, the threshold voltage Vt in a case where the current flows through the channel facing the trench gate electrode 28 and the threshold voltage Vt in a case where the current flows through the channel facing the planer gate electrode 31 have the relationship such that both of them equal. As a result, the current in the vertical direction flows through the trench gate TG much easily, compared with a conventional construction. Thus, reduction of the on-state resistance is improved.

Figure 21:
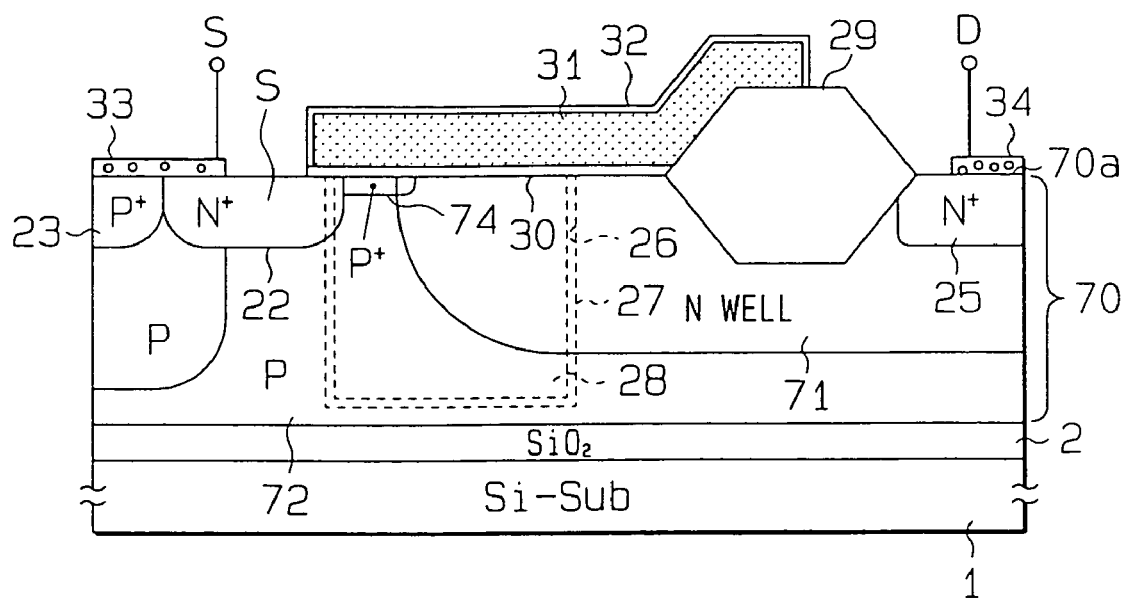
FIG. 21 is a cross sectional view showing another lateral type power MOS transistor of the semiconductor device according to a modification of the fifth embodiment.

As shown in FIG. 21, a device has another construction as a modification of the device shown in FIG. 20. That is, the P$^+$ type region 74 can be formed in a portion of the base region 72 to be a channel portion facing the planer gate electrode 31. In this case, the relative relationship between the threshold voltage Vt in the lateral direction and the threshold voltage Vt in the vertical direction can be controlled much preferably. Further, the P$^-$ type region can be formed in a portion of the base region 72 to be a channel region facing the trench gate electrode 28 as described in the third embodiment. Thus, in the semiconductor device, the current in a vertical direction flows by a trench gate easily so that an on-state resistance is reduced.

Sixth Embodiment

Next, a sixth embodiment of the present invention is explained as follows.

Figure 22:
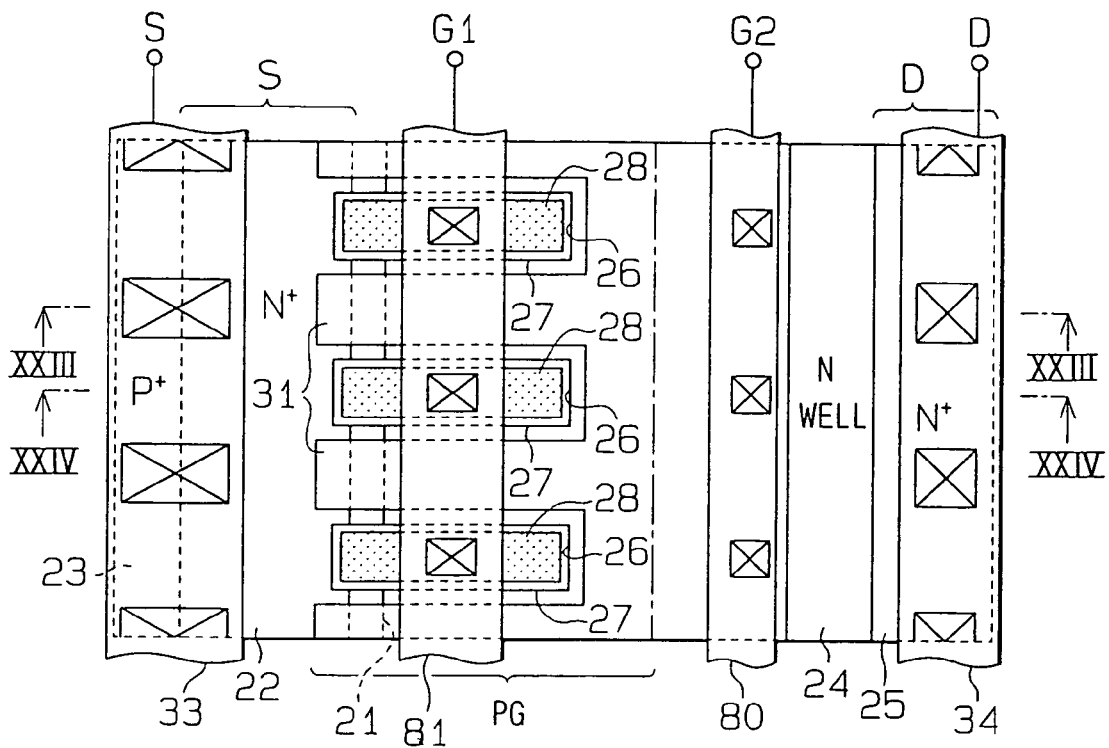
FIG. 22 is a plan view showing a lateral type power MOS transistor of a semiconductor device according to a sixth embodiment of the present invention.
Figure 23:
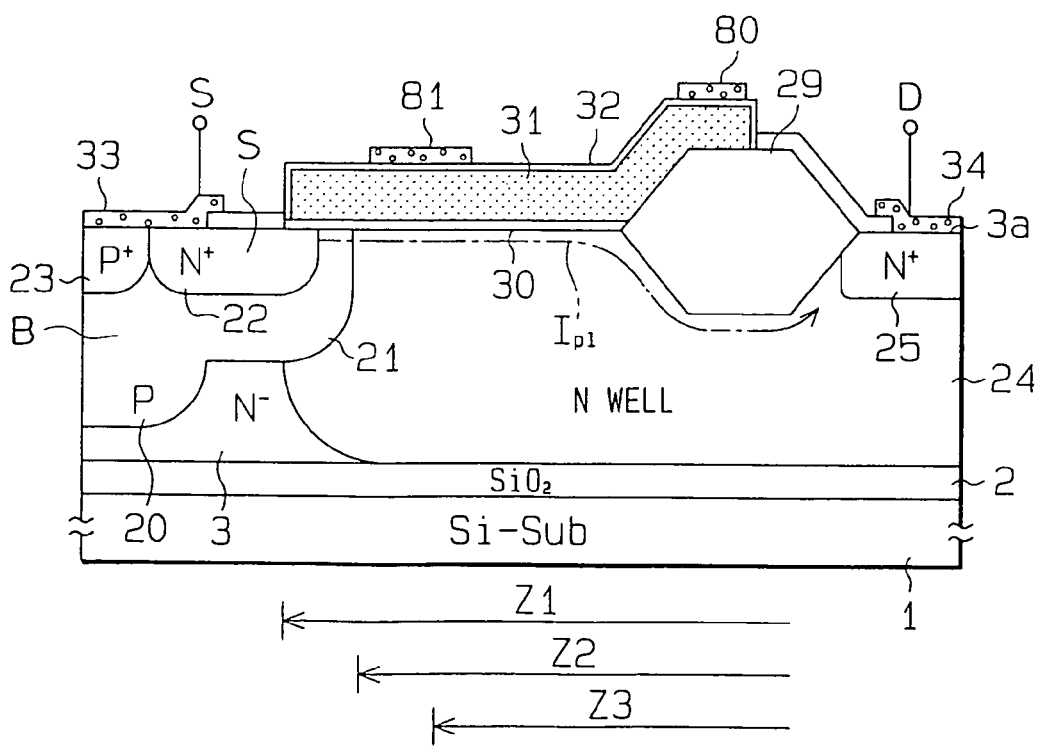
FIG. 23 is a cross sectional view showing the transistor of the semiconductor device taken along line XXIII-XXIII in FIG. 22.
Figure 24:
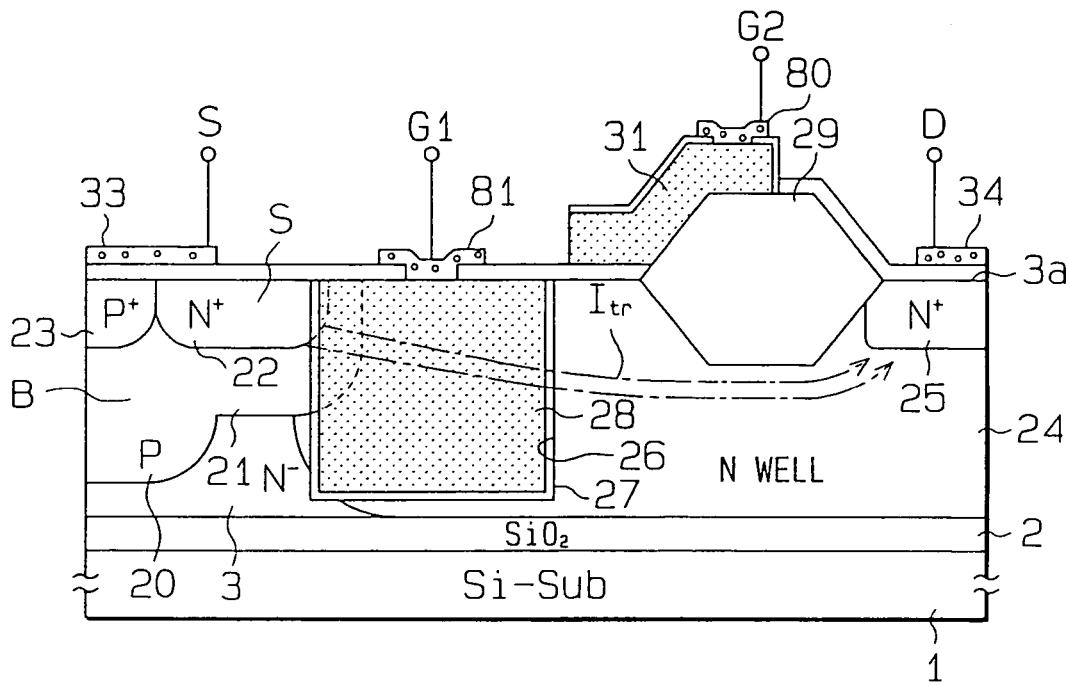
FIG. 24 is a cross sectional view showing the transistor of the semiconductor device taken along line XXIV-XXIV in FIG. 22.

FIG. 22 is a plan view showing a lateral type MOS transistor according to the present embodiment, which is different from the transistor shown in FIG. 2. FIG. 23 is across sectional view showing the transistor taken along line XXIII-XXIII in FIG. 22. FIG. 24 is a vertical cross sectional view showing the transistor taken along line XXIV-XXIV in FIG. 22.

In FIGS. 22-24, the planer gate electrode 31 and the trench gate electrode 28 are separated each other. Further, an aluminum wiring 80 connecting to the planer gate electrode 31 and another aluminum wiring 81 connecting to the trench gate electrode 28 are formed independently. The first gate voltage G1 is applied to the trench gate electrode 28 through the aluminum wiring 81. The second gate voltage G2 is applied to the planer gate electrode 31 through the aluminum wiring 80.

Thus, the aluminum wiring 80 for the planer gate PG and the aluminum wiring 81 for the trench gate TG are formed independently, so that the threshold voltage Vt in the vertical direction and the threshold voltage Vt in the lateral direction are controlled independently.

By controlling the voltages of the planer gate PG and the trench gate TG independently, the current flows in the vertical direction rather than in the lateral direction. Thus, the current flows deeply, and the channel density is improved, so that the on-state resistance is reduced.

The inventors have performed an experiment for confirming the effect. This experiment is explained as follows with reference to FIG. 25.

Figure 25:
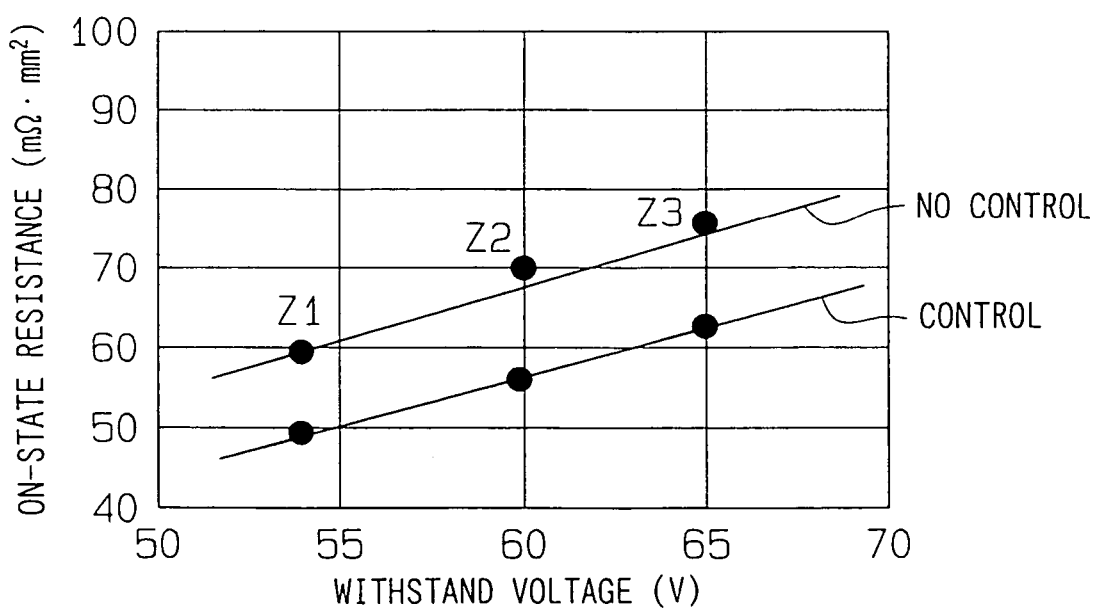
FIG. 25 is a graph showing a measurement result of an on-state resistance versus a withstand voltage, according to the sixth embodiment.

In FIG. 25, the horizontal axis represents the withstand voltage, and the vertical axis represents the on-state resistance. As a comparison, a case (i.e., NO CONTROL) where the voltages of the planer gate PG and the trench gate TG are not controlled independently is compared with another case (i.e., CONTROL) where the voltages of the planer gate PG and the trench gate TG are controlled independently. Specifically, a case (i.e., CONTROL) where the relative relationship between the threshold voltage Vt in the vertical direction and the threshold voltage Vt in the lateral direction is controlled is compared with another case (i.e., NO CONTROL) where the relative relationship is not controlled. Further, in FIG. 23, a device (i.e., Z1) having the N type well region 24 expanding in a source side represents as Z1. Other devices (i.e., Z2, Z3) having the N type well region 24 expanding narrower than the device Z1 represent Z2 and Z3, respectively, so that the devices Z2, Z3 are compared with the device Z1.

As shown in FIG. 25, by controlling the voltages of the planer gate PG and the trench gate TG independently, the reduction effect of the on-state resistance is confirmed. Specifically, when the relative relationship between the threshold voltage Vt in the vertical direction and the threshold voltage Vt in the lateral direction is controlled, the reduction effect of the on-state resistance becomes larger, compared with the case (i.e., NO CONTROL) where the relative relationship is not controlled.

Thus, the device includes the planer gate electrode 31, the aluminum wiring (i.e., the wiring for the trench gate TG) 81 and the other aluminum wiring (i.e., the wiring for the planer gate PG) 80. The planer gate electrode 31 is formed on the principal plane 3a through the gate oxide film (i.e., the gate insulation film) 30, and provided by an independent part independent from the trench gate TG. The aluminum wiring 81 works for applying the first gate voltage G1 to the trench gate electrode 28. The other aluminum wiring 80 works for applying the second gate voltage G2 to the planer gate electrode 31. Therefore, the voltages of the planer gate electrode 31 and the trench gate electrode 28 are controlled independently, so that the current flows in the vertical direction rather than in the lateral direction. Thus, the current flows deeply, and the channel density is improved, so that the reduction of the on-state resistance is obtained.

Seventh Embodiment

Next, a seventh embodiment of the present invention is explained as follows.

Figure 26:
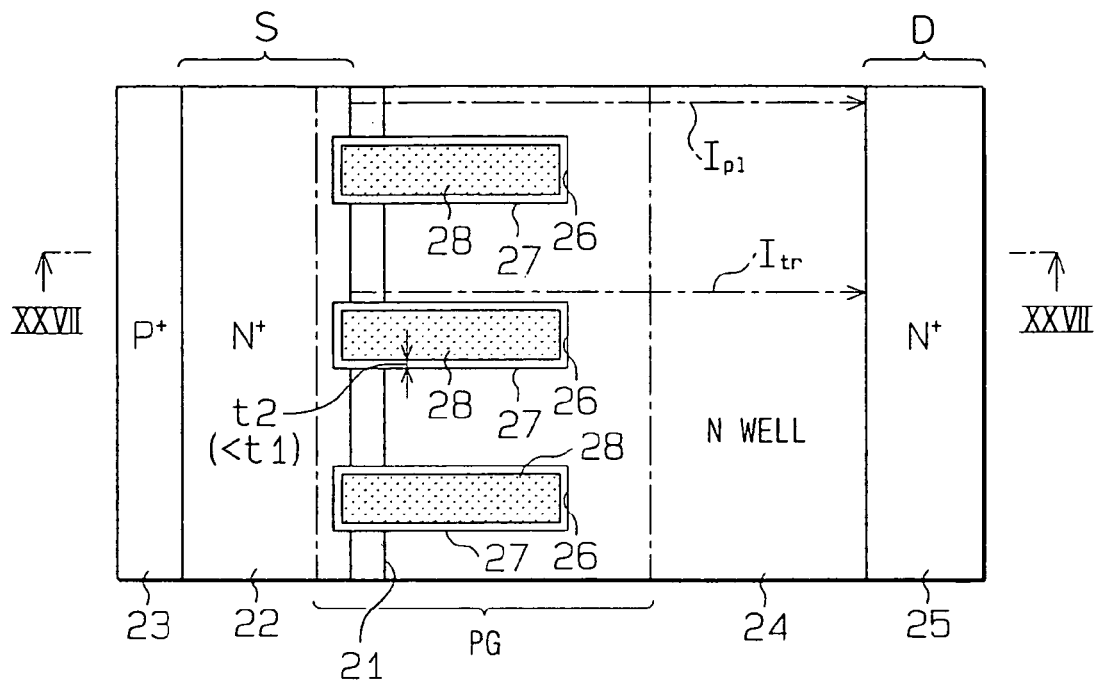
FIG. 26 is a plan view showing a lateral type power MOS transistor of a semiconductor device according to a seventh embodiment of the present invention.
Figure 27:
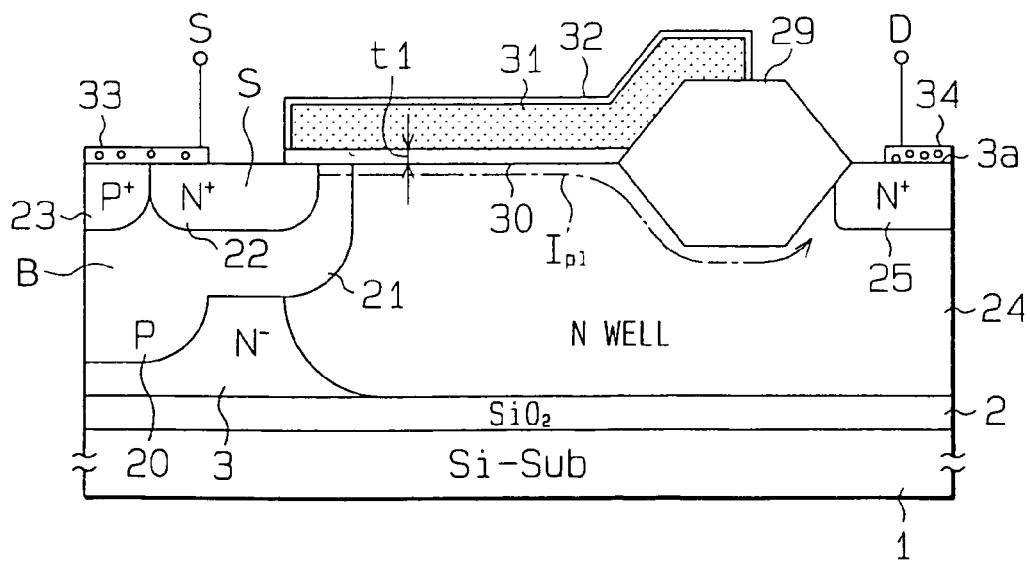
FIG. 27 is a cross sectional view showing the transistor of the semiconductor device taken along line XXVII-XXVII in FIG. 26.

FIG. 26 is a plan view showing a lateral type MOS transistor according to the present embodiment, which is different from the transistor shown in FIG. 2. FIG. 27 is a cross sectional view showing the transistor taken along line XXVII-XXVII in FIG. 26.

In FIGS. 26 and 27, the thickness t2 of the gate oxide film (i.e., the silicon oxide film) 27 in the trench gate TG is thinner than the thickness t1 of the gate oxide film (i.e., the silicon oxide film) 30 in the planer gate PG (i.e., t2<t1). Thus, the threshold voltage Vt in the lateral direction at the planer gate electrode 31 can be controlled to become higher than the threshold voltage Vt in the vertical direction at the trench gate electrode 28.

As described above, the device includes the trench gate electrode 28 and the planer gate electrode 31. The trench gate electrode 28 is formed inside the trench through the gate oxide film (i.e., the first gate insulation film) 27. The planer gate electrode 31 is formed on the principal plane 3a through the gate oxide film (i.e., the second gate insulation film) 30, which is thicker than the gate oxide film (i.e., the first gate insulation film) 27. Thus, the threshold voltage Vt in a case where the current flows through the channel region facing the planer gate electrode 31 becomes higher than the threshold voltage Vt in a case where the current flows through the channel region facing the trench gate electrode 28. As a result, the current flows in the vertical direction by the trench gate TG so that the reduction of the on-state resistance is obtained.

Eighth Embodiment

Next, an eighth embodiment of the present invention is explained as follows.

Figure 28:
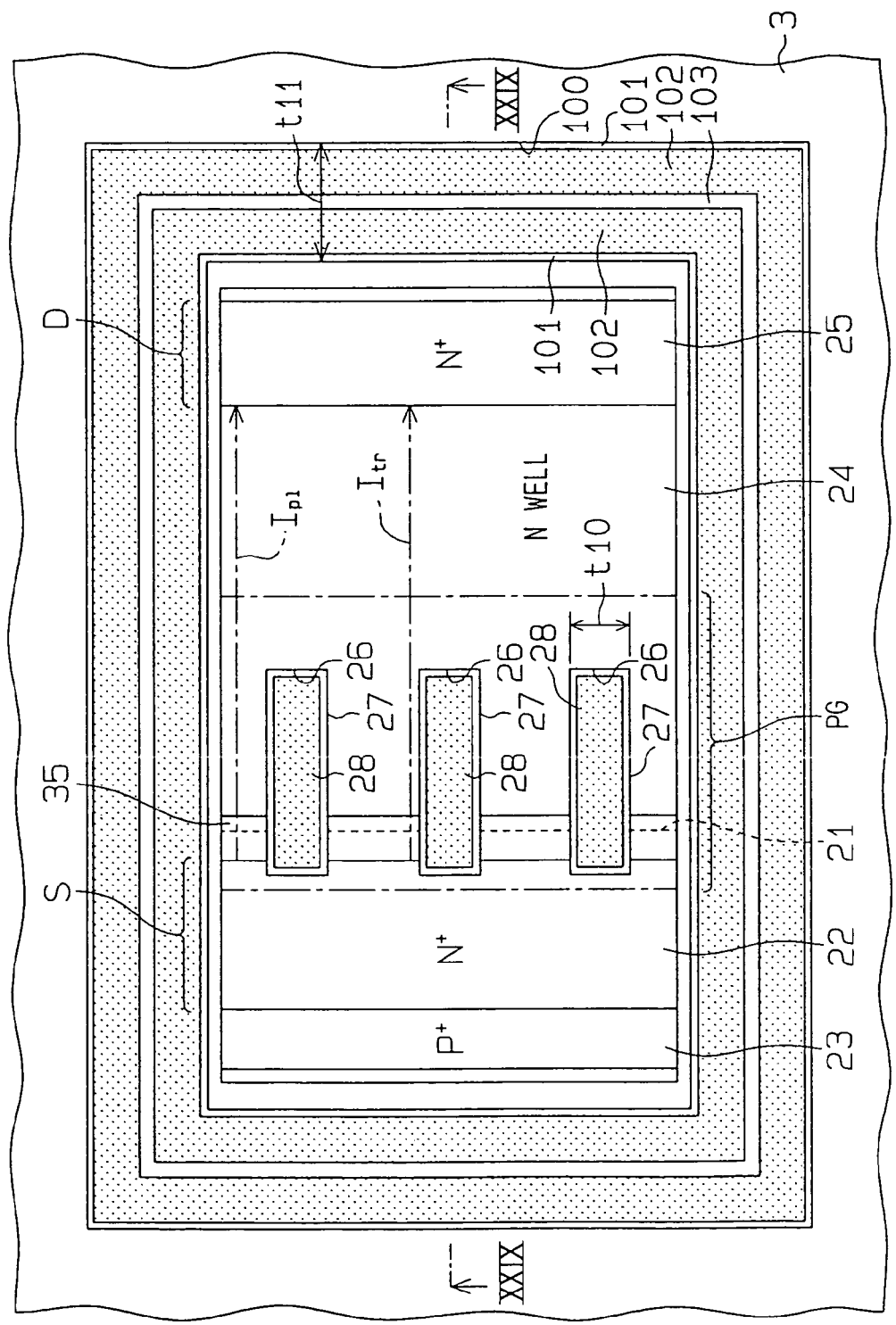
FIG. 28 is a plan view showing a lateral type power MOS transistor of a semiconductor device according to an eighth embodiment of the present invention.
Figure 29:
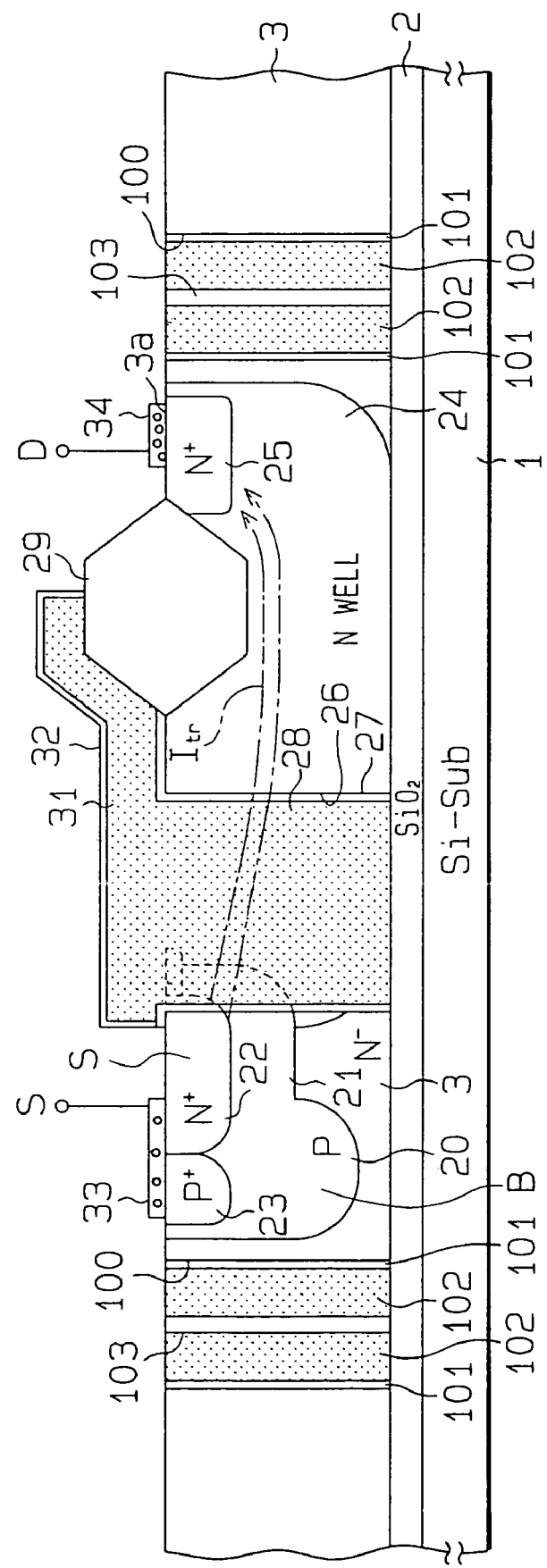
FIG. 29 is a cross sectional view showing the transistor of the semiconductor device taken along line XXIX-XXIX in FIG. 28.

FIG. 28 is a plan view showing a lateral type MOS transistor according to the present embodiment, which is different from the transistor shown in FIG. 2. FIG. 29 is a cross sectional view showing the transistor taken along line XXIX-XXIX in FIG. 28.

As shown in the plan view of FIG. 28, a device separation trench 100 is formed in the silicon layer 3 around the lateral type MOS transistor. The trench 26 for forming the gate and the trench 100 for separating the device are formed at the same time. As shown in FIG. 29, both trenches 26, 100 reach the insulation film (i.e., the embedded silicon oxide film) 2.

Here, the gate oxide film (i.e., the silicon oxide film) 27 is formed on the inner wall of the trench 26 for forming the gate. The trench gate electrode (i.e., the poly silicon gate electrode) 28 is disposed inside the trench 26 through the gate oxide film 27. The thickness of the gate oxide film (i.e., the silicon oxide film) 27 is about 300 Angstrom. On the other hand, in the trench 100 for separating the device, as shown in FIG. 29, a silicon oxide film 101 is formed on the inner wall of the trench 100. Further, a poly silicon film 102 is formed inside the trench 100 through the film 101. Furthermore, a silicon oxide film 103 is formed (i.e., filled) inside the trench 100 through the silicon film 102. The gate oxide film (i.e., the silicon oxide film) 27 and the silicon oxide film 101 are formed at the same time. Further, the trench gate electrode (i.e., the poly silicon gate electrode) 28 and the poly silicon film 102 are formed at the same time. Thus, the silicon oxide film 101 is formed together with the gate oxide film (i.e., the silicon oxide film) 27 at the same time to simplify the manufacturing process. Therefore, the thickness of the silicon oxide film 101 is about 300 Angstrom.

Thus, the gate oxide film 27 of the gate trench is formed to have the thickness (i.e., about 300 Angstrom) for enhancing the reduction effect of the on-state resistance. Further, the thickness of the silicon oxide film (i.e., the trench side oxide film) 101 in the trench 100 for separating the device is the same as the thickness of the gate oxide film 27 (i.e., about 300 Angstrom). However, it provides a construction of poly silicon/oxide film/embedded poly silicon. Therefore, the device separation withstand voltage (i.e., between 50 volts and 150 volts) is secured. Specifically, in the planer gate PG of the lateral type power device, the current flows deeply, and the channel density is improved so that the reduction of the on-state resistance is obtained. To realize this reduction, when the current flows deeply by using the trench gate TG so that the reduction of the on-state resistance is obtained, the oxide film is required to be thinner as much as possible (i.e., about 300 Angstrom) together with holding the gate withstand voltage (e.g., about 10 volts). On the other hand, in the device separation trench, to hold the device separation withstand voltage (i.e., between 50 volts and 150 volts), the trench sidewall oxide film is required to be thicker (e.g., equal to or thicker than about 1000 Angstrom). Therefore, to satisfy both of the achievement of the low on-state resistance by using the trench gate TG and the securement of the device separation withstand voltage of the device separation trench, the trench 100 for separating the device has the construction of the embedded poly silicon/oxide film/embedded poly silicon.

In the trench 100 for separating the device having the embedded poly silicon/oxide film/embedded poly silicon construction, the manufacturing process is described as follows.

Both trenches 26, 100 are formed at the same time. At this time, a groove width t11 of the trench 100 for separating the device becomes about 2 μm, as shown in FIG. 28. A width t10 of the gate trench 26 becomes about 1 μm, so that the groove width t11 of the device separation trench becomes larger than the width t10 of the gate trench. After that, the silicon oxide films (27, 101) are formed on the inner wall of the trenches 26, 100 at the same time, respectively. Further, a poly silicon film having the thickness of about 0.9 μm is deposited so that the gate trench 26 is embedded with the poly silicon film (28) completely. Then, the poly silicon film is etched back. Here, the trench 100 for separating the device is not completely embedded with the poly silicon film (102). The surface of the poly silicon film 2 disposed in the trench 100 for separating the device is oxidized so that the silicon oxide film 103 having the thickness to secure the device insulation withstand voltage is formed.

Thus, in the present embodiment, the insulation film (101) is formed inside the trench 100 for separating the device disposed in the silicon layer 3 as a semiconductor substrate around the device-to-be-formed region. The insulation film (101) is the same film as the gate insulation film (27) for the trench gate electrode. A film (102) is formed inside the trench 100 through the insulation film (101). The film (102) is the same film as the film composing the trench gate electrode 28. Further, the insulation film (103) is formed inside the trench 100 through the film (102). Accordingly, the parts composing the trench gate TG (i.e., the trench, the gate insulation film and the trench gate electrode) and the parts composing the trench separation (i.e., the trench, the insulation and the film disposed inside the insulation film) are formed at the same time.

Thus, in the semiconductor device, the current in a vertical direction flows by a trench gate easily so that an on-state resistance is reduced.

Ninth Embodiment

Next, a ninth embodiment of the present invention is explained as follows.

Figure 30:
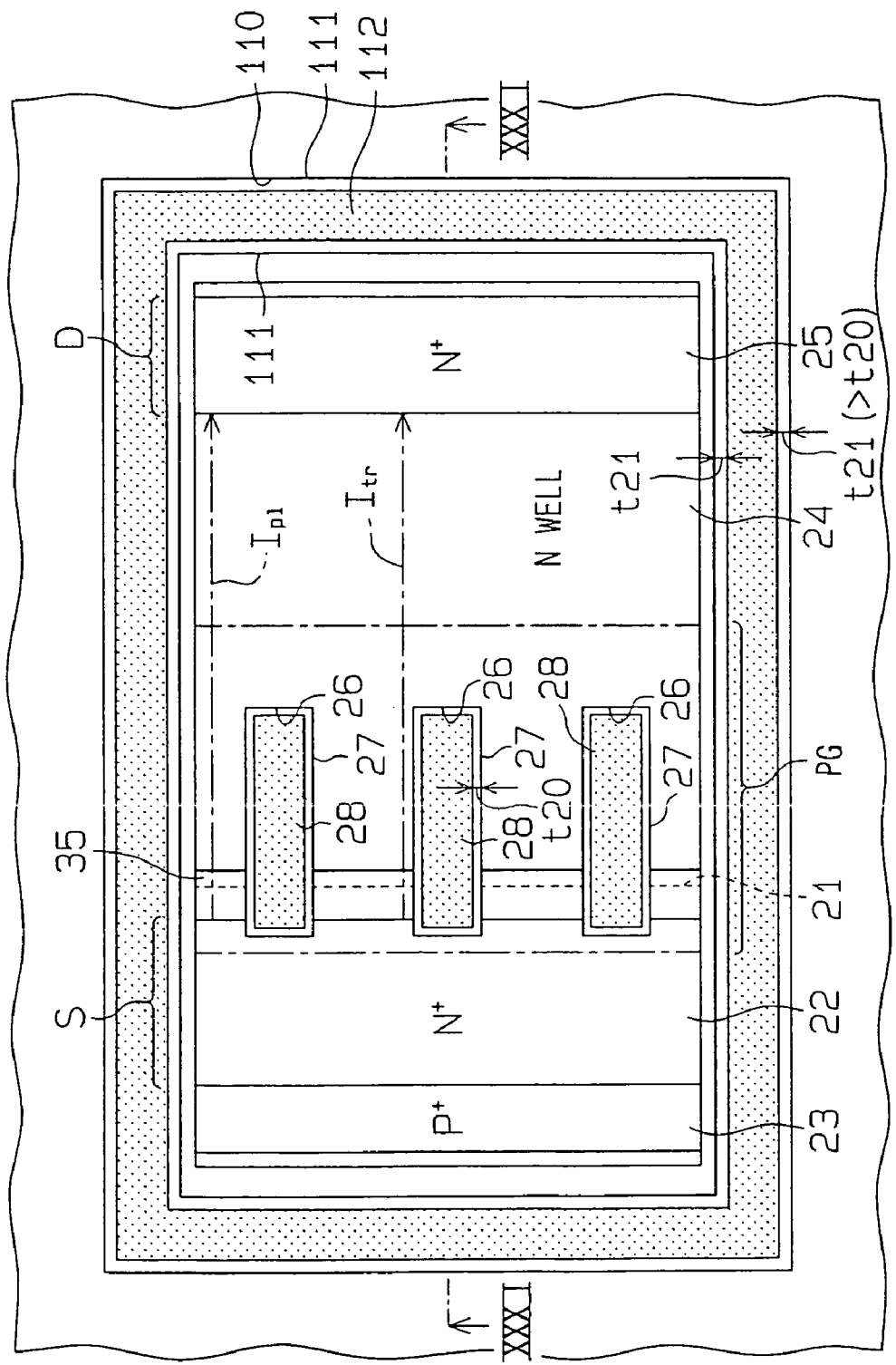
FIG. 30 is a plan view showing a lateral type power MOS transistor of a semiconductor device according to a ninth embodiment of the present invention.
Figure 31:
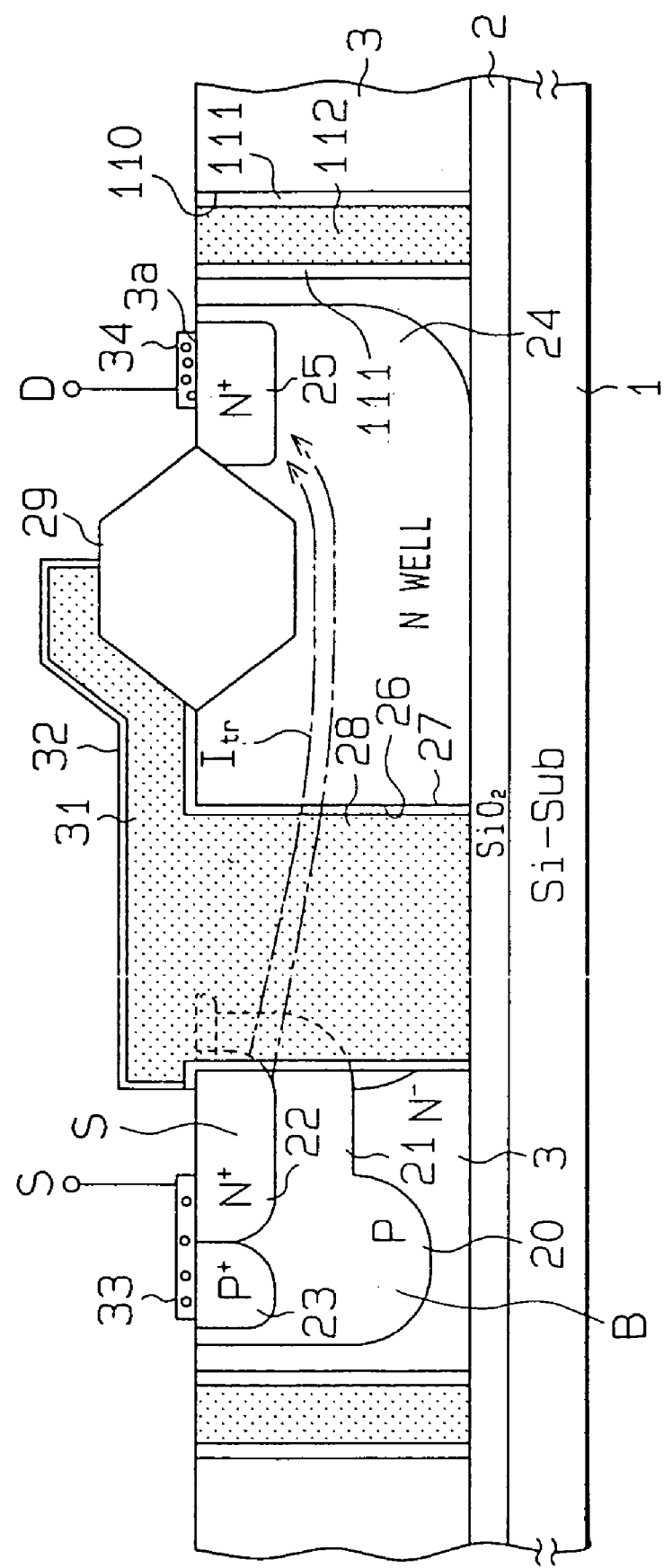
FIG. 31 is a cross sectional view showing the transistor of the semiconductor device taken along line XXXI-XXXI in FIG. 30.

FIG. 30 is a plan view showing a lateral type MOS transistor according to the present embodiment, which is different from the transistor shown in FIG. 28. FIG. 31 is a cross sectional view showing the transistor taken along line XXXI-XXXI in FIG. 30.

As shown in FIG. 30, the thickness t21 of the oxide film (i.e., the silicon oxide film 111) in the device separation trench becomes thicker than the thickness t20 of the oxide film (i.e., the gate oxide film 27) in the trench gate TG. Specifically, a silicon oxide film 111 is formed on the inner wall of the trench 110 for separating the device. The silicon oxide film 111 is thicker than the gate oxide film 27 for the trench gate electrode. Further, a poly silicon film 112 is formed inside the trench 110 through the silicon oxide film 111. The poly silicon film 112 is the same film as the film composing the trench gate electrode 28.

Figure 32:
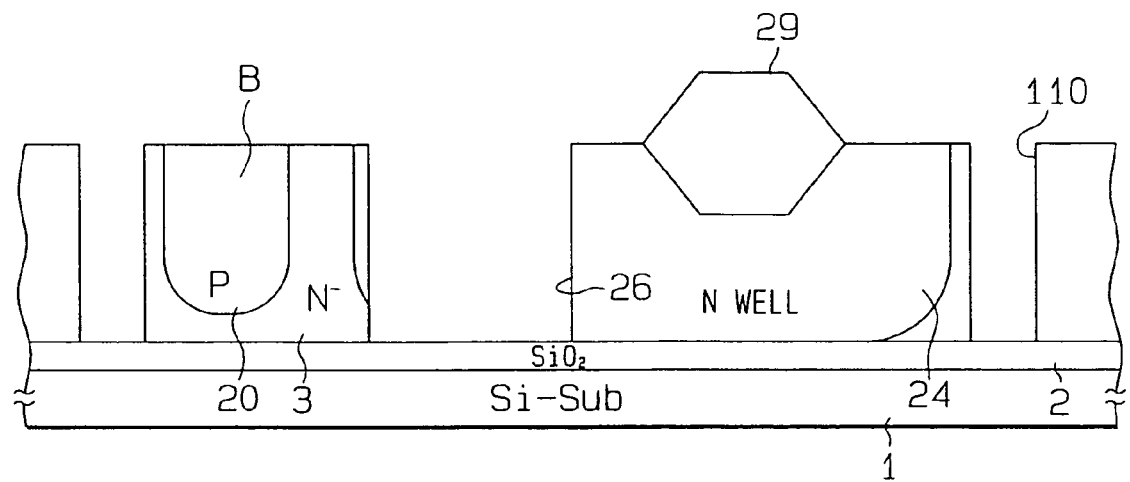
FIG. 32 is a cross sectional view explaining a method for manufacturing the transistor of the semiconductor device according to the ninth embodiment.
Figure 33:
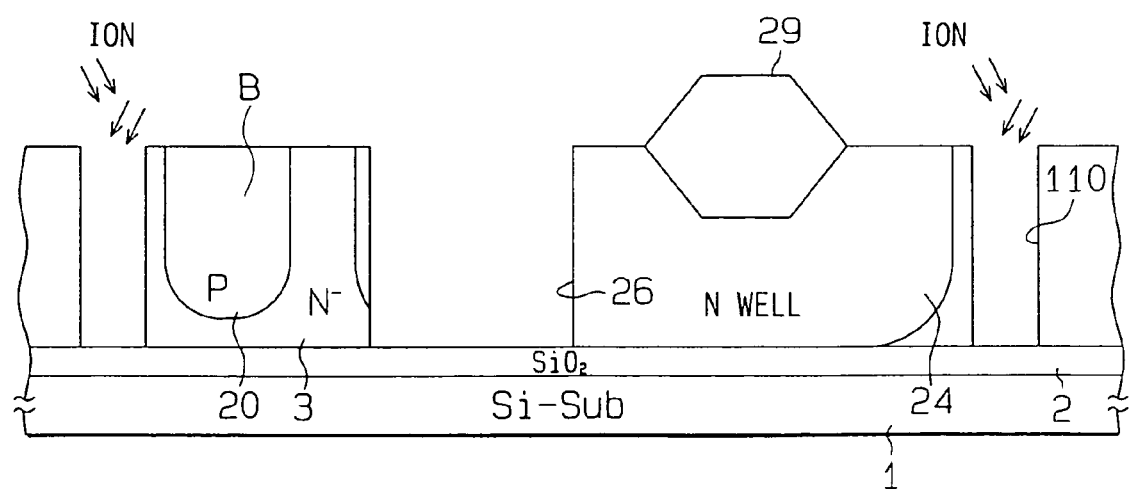
FIG. 33 is a cross sectional view explaining the method for manufacturing the transistor of the semiconductor device according to the ninth embodiment.

To manufacture the above construction, in the manufacturing process, after the trenches 26, 110 are formed as shown in FIG. 32, ions is implanted selectively and heavily doped in the inner wall of the trench 110, as shown in FIG. 33. Then, the silicon oxide film is formed on the inner wall of the trenches 26, 110 by the thermal oxidation method. In the thermal oxidation process, oxidation is enhanced at a portion, in which the ions are selectively implanted. As shown in FIGS. 30 and 31, the thickness t21 of the oxide film in the device separation trench can become thicker than the thickness t20 of the oxide film in the trench gate TG.

Therefore, by implanting the ions heavily and selectively in the inner wall of the trench 110, the thickness t21 of the oxide film in the device separation trench becomes thicker than the thickness t20 of the oxide film in the trench gate TG by the enhanced oxidation effect. Thus, the device separation withstand voltage is secured, and the low on-state resistance by using the trench gate TG is achieved. Further, the parts composing the trench gate TG (i.e., the trench, the gate insulation film and the trench gate electrode) and the parts composing the trench separation (i.e., the trench, the insulation and the film disposed inside the insulation film) are formed at the same time. Thus, the IC is manufactured at a low cost and has high quality.

As described above, in the present embodiment, the insulation film (111) is formed on the inner wall of the trench 110 for separating the device. The trench 110 is disposed in the silicon layer 3 as the semiconductor substrate around the device-to-be-formed region. The insulation film (111) is thicker than the gate insulation film (27) for the trench gate electrode. The film (112) is formed inside the trench 110 through the film (111). The film (112) is the same film as the film composing the trench gate electrode 28. Accordingly, the device separation withstand voltage is secured, and the parts composing the trench gate TG (i.e., the trench, the gate insulation film and the trench gate electrode) and the parts composing the trench separation (i.e., the trench, the insulation and the film disposed inside the insulation film) can be formed at the same time.

Thus, in the semiconductor device, the current in a vertical direction flows by a trench gate easily so that an on-state resistance is reduced.

Tenth Embodiment

Next, a tenth embodiment of the present invention is explained as follows.

Figure 34:
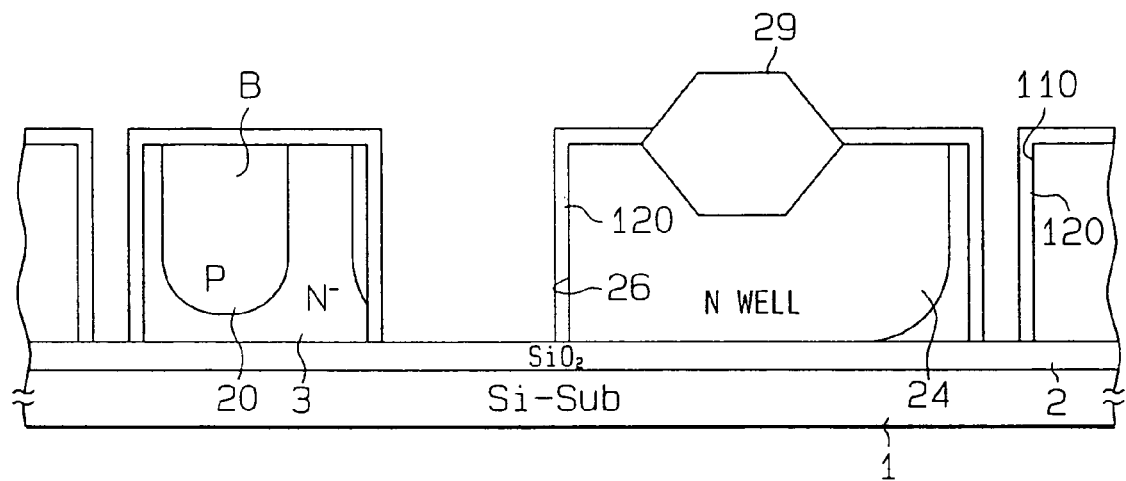
FIG. 34 is a cross sectional view explaining a method for manufacturing a lateral type power MOS transistor of a semiconductor device according to a tenth embodiment of the present invention.
Figure 35:
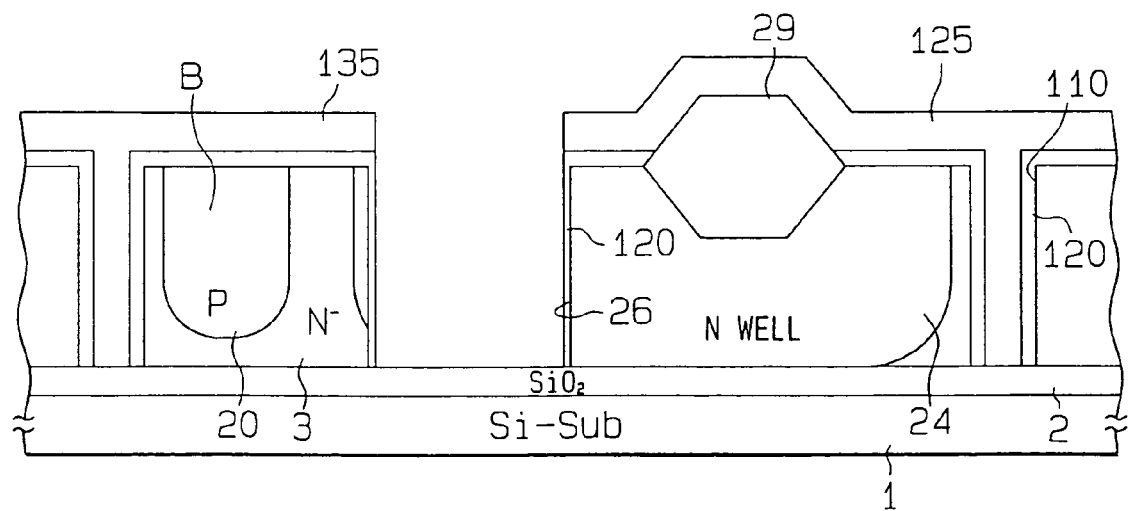
FIG. 35 is a cross sectional view explaining the method for manufacturing the transistor of the semiconductor device according to the tenth embodiment.

As shown in FIG. 34, the trenches 26, 110 are formed, and the silicon oxide film 120 is formed on the inner wall of each trench 26, 110. After that, as shown in FIG. 35, the silicon oxide film 120 in the trench 110 is covered with a mask 125. Further, the silicon oxide film 120 in the trench 26 is exposed. In this state, the silicon oxide film 120 in the trench 26 is etched so that the thickness of the film 120 becomes a predetermined thickness (i.e., about 300 Angstrom). After that, the poly silicon is embedded in the trenches 26, 110. Thus, as shown in FIGS. 30 and 31, the thickness t21 of the oxide film in the device separation trench can become thicker than the thickness t20 of the oxide film in the trench gate TG.

As described above, in the present embodiment, the silicon oxide film 120 in the trench 26 is etched with using the mask 125 so as to have the predetermined thickness (i.e., about 300

Angstrom) after the silicon oxide film 120 is formed on the inner wall of each trench 26, 110. Thus, the device separation withstand voltage is secured, and the low on-state resistance with using the trench gate TG is achieved. Further, the parts composing the trench gate TG (i.e., the trench, the gate insulation film and the trench gate electrode) and the parts composing the trench separation (i.e., the trench, the insulation and the film disposed inside the insulation film) are formed at the same time so that the IC is manufactured at a low cost and has high quality.

Thus, in the semiconductor device, the current in a vertical direction flows by a trench gate easily so that an on-state resistance is reduced.

Eleventh Embodiment

Next, an eleventh embodiment of the present invention is explained as follows.

Figure 36:
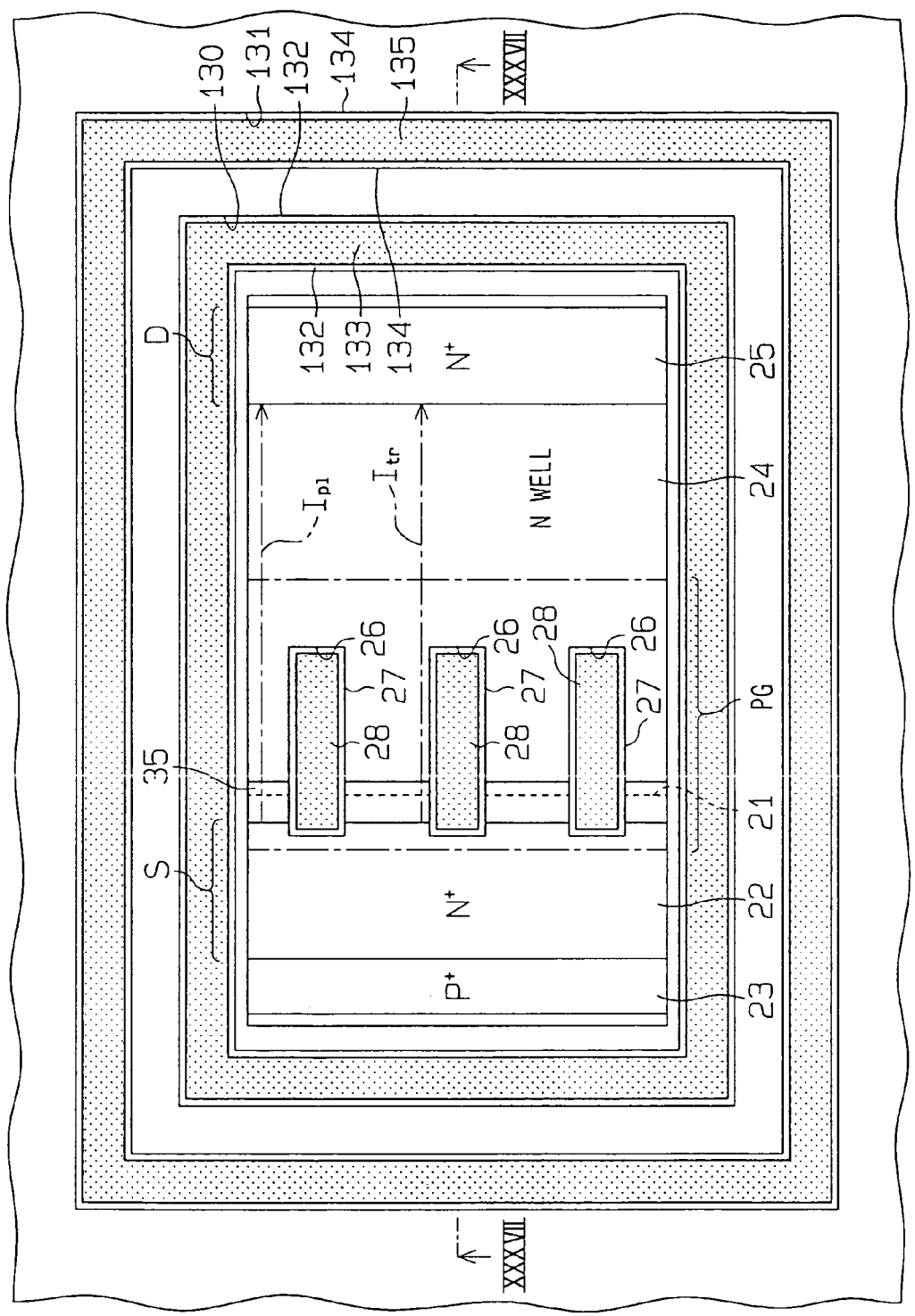
FIG. 36 is a plan view showing a lateral type power MOS transistor of a semiconductor device according to an eleventh embodiment of the present invention.
Figure 37:
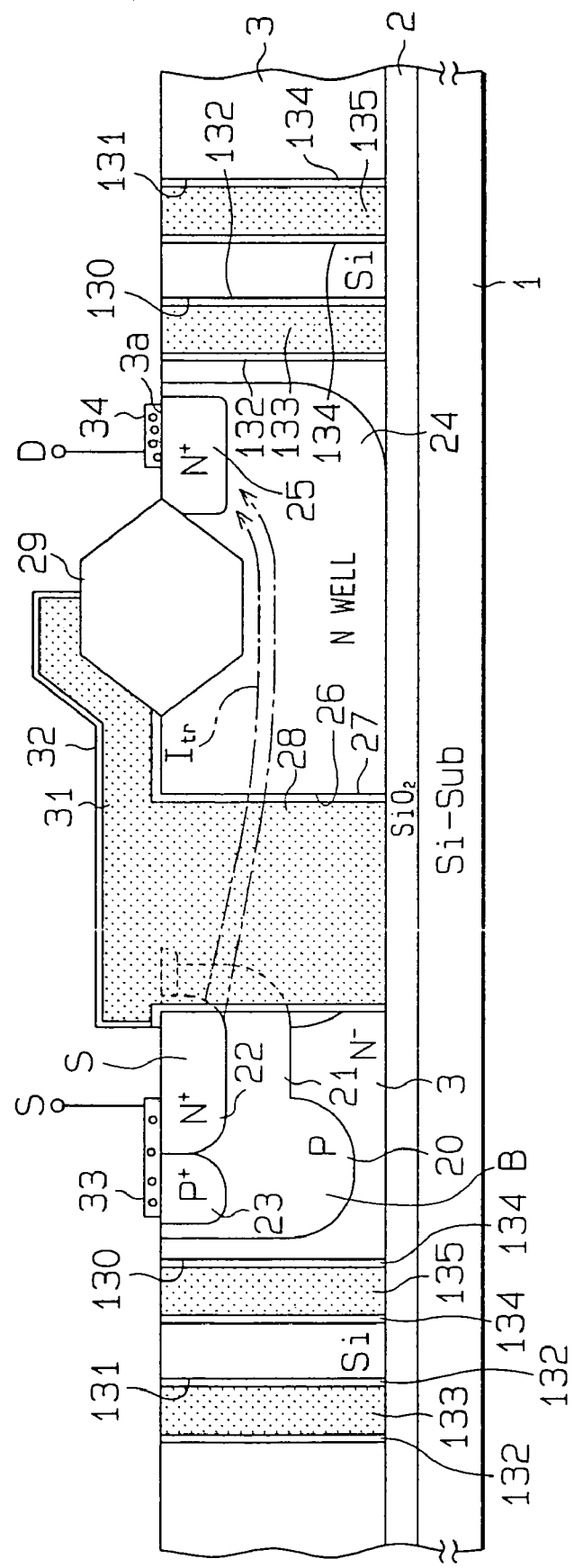
FIG. 37 is a cross sectional view showing the transistor of the semiconductor device taken along line XXXVII-XXXVII in FIG. 36.

FIG. 36 is a plan view showing a lateral type MOS transistor according to the present embodiment, which is different from the transistor shown in FIG. 28. FIG. 37 is a cross sectional view showing the transistor taken along line XXX-VII-XXXVII in FIG. 36.

In the present embodiment, the trench for separating the device is formed doubly around the lateral type MOS transistor. Specifically, a trench 130 is formed around the lateral type MOS transistor, and another trench 131 is formed outside the trench 130.

In detail, a silicon oxide film 132 is formed on the inner wall of the trench 130 for separating the device. Further, a poly silicon film 133 fills the trench 130 through the silicon oxide film 132. Similarly, another silicon oxide film 134 is formed on the inner wall of the trench 131 for separating the device. Further, a poly silicon film 135 fills the trench 131 through the silicon oxide film 134.

Thus, the trench for separating the device is formed doubly around the lateral type MOS transistor, so that the separation withstand voltage is improved by only changing the layout.

Although the trench for separating the device is formed doubly around the lateral type MOS transistor, the trench can be formed to include multiple trenches such as triple or quadruple trenches. The point is such that the trench is formed to include equal to or more than double trenches so that the separation withstand voltage can be improved only by changing the layout.

As described above, in the present embodiment, the trench for separating the device is formed to include equal to or more than double trenches disposed around the lateral type MOS transistor. Thus, the device separation withstand voltage is secured, and the low on-state resistance with using the trench gate TG is achieved. Further, the parts composing the trench gate TG (i.e., the trench, the gate insulation film and the trench gate electrode) and the parts composing the trench separation (i.e., the trench, the insulation and the film disposed inside the insulation film) are formed at the same time so that the IC is manufactured at a low cost and has high quality.

Specifically, the trench for separating the device is formed to include equal to or more than double trenches in the silicon layer 3 as a semiconductor substrate around the device-to-be-formed region. The insulation film (132, 134) is formed inside of each trench 130, 131, the insulation film (132, 134) being the same film as the gate insulation film (27) for the trench gate electrode. Further, the film (133, 135) is formed inside the trench 130, 131 through the insulation film (132, 134), the film being the same film as the film composing the trench gate electrode 28. Therefore, the device separation withstand voltage is secured, and the parts composing the trench gate TG (i.e., the trench, the gate insulation film and the trench gate electrode) and the parts composing the trench separation (i.e., the trench, the insulation and the film disposed inside the insulation film) are formed at the same time. Thus, in the semiconductor device, the current in a vertical direction flows by a trench gate easily so that an on-state resistance is reduced.

Next, technical idea drawn from the above third and fourth embodiments is described as follows.

(A) A method for manufacturing a semiconductor device, which includes:

a base region (20, 21) having a second conductive type and formed on a surface portion of a principal plane (3a) of a semiconductor substrate (3) having a first conductive type;

a source region (22) having the first conductive type and formed on the surface portion of the principal plane (3a) in the base region (20, 21) to be shallower than the base region (20, 21);

a drain region (25) having the first conductive type, formed on the surface portion of the principal plane (3a), and spaced to the base region (20, 21);

a trench (26) dug from the principal plane (3a) of the semiconductor substrate (3), wherein the trench (26) is formed such that, in a planer construction of the trench (26), the trench (26) penetrates the base region (20) disposed between the source region (22) and the drain region (25) in a direction from the source region (22) to the drain region (25);

a trench gate electrode (28) formed inside the trench (26) through a gate insulation film (27); and a planer gate electrode (31) formed on the principal plane (3a) through a gate insulation film (30), wherein the method is characterized by comprising the steps of:

forming the trench (26) on the principal plane (3a) of the semiconductor substrate (3) having the first conductive type;

forming the gate insulation film (27, 30) on the semiconductor substrate (3) including the inner wall of the trench (26);

implanting ions of a first conductive type element into a portion of an inner wall of the trench (26) to be a channel portion of the surface portion;

forming the planer gate electrode (31) on the principal plane (3a) through the gate insulation film (30) together with forming the trench gate electrode (28) inside the trench (26) through the gate insulation film (27); and forming the source region (22) having the first conductive type by an ion implantation method with using the planer gate electrode (28) as a mask together with forming the base region (21) having the second conductive type.

In the manufacturing method of the semiconductor device, the trench is formed on the principal plane of the semiconductor substrate having the first conductive type. The gate insulation film is formed on the semiconductor substrate including the inner wall of the trench. Further, the ions of the first conductive type element is implanted into the portion of the inner wall of the trench (26) to be a channel portion of the surface portion. Furthermore, the trench gate electrode is formed inside the trench through the gate insulation film, and the planer gate electrode is formed on the principal plane through the gate insulation film. Then, the source region having the first conductive type is formed by the ion implantation method with using the planer gate electrode as a mask together with forming the base region having the second conductive type. Thus, the semiconductor device is obtained.

(B) A method for manufacturing a semiconductor device, which includes:

a base region (20, 21) having a second conductive type and formed on a surface portion of a principal plane (3a) of a semiconductor substrate (3) having a first conductive type;

a source region (22) having the first conductive type and formed on the surface portion of the principal plane (3a) in the base region (20, 21) to be shallower than the base region (20, 21);

a drain region (25) having the first conductive type, formed on the surface portion of the principal plane (3a), and spaced to the base region (20, 21);

a trench (26) dug from the principal plane (3a) of the semiconductor substrate (3), wherein the trench (26) is formed such that, in a planer construction of the trench (26), the trench (26) penetrates the base region (20) disposed between the source region (22) and the drain region (25) in a direction from the source region (22) to the drain region (25);

a trench gate electrode (28) formed inside the trench (26) through a gate insulation film (27); and a planer gate electrode (31) formed on the principal plane (3a) through a gate insulation film (30), wherein the method is characterized by comprising the steps of:

forming the trench (26) on the principal plane (3a) of the semiconductor substrate (3) having the first conductive type;

forming the gate insulation film (27, 30) on the semiconductor substrate (3) including the inner wall of the trench (26);

forming the trench gate electrode (26) inside the trench (26) through the gate insulation film (27) together with forming the planer gate electrode (31) on the principal plane (3a) through the gate insulation film (30), wherein the trench gate electrode (26) is doped with the first conductive type element; and forming the source region (22) having the first conductive type by an ion implantation method with using the planer gate electrode (28) as a mask together with the base region (21) having the second conductive type.

In the manufacturing method of the semiconductor device, the trench is formed on the principal plane of the semiconductor substrate having the first conductive type. Then, the gate insulation film is formed on the semiconductor substrate including the inner wall of the trench. Further, the trench gate electrode doped with the first conductive type element is formed inside the trench through the gate insulation film, and the planer gate electrode is formed on the principal plane through the gate insulation film. Then, the source region having the first conductive type is formed by the ion implantation method with using the planer gate electrode as a mask together with forming the base region having the second conductive type. As a result, the doped first conductive type element is diffused into the substrate side so that the semiconductor device is obtained.

Such changes and modifications are to be understood as being within the scope of the present invention as defined by the appended claims.

What is claimed is:

1. A method for manufacturing a semiconductor device, which includes:

a semiconductor substrate with a first conductive type having a principal plane;

a base region having a second conductive type and disposed on the principal plane of the semiconductor substrate;

a source region having the first conductive type and disposed on the principal plane of the semiconductor substrate in the base region to be shallower than the base region;

a drain region having the first conductive type, disposed on the principal plane of the semiconductor substrate, and spaced to the base region;

a trench disposed on the principal plane of the semiconductor substrate, wherein the trench has a planer construction in such a manner that the trench penetrates the base region disposed between the source region and the drain region in a direction from the source region to the drain region;

a trench gate electrode disposed in the trench through a gate insulation film; and a planer gate electrode disposed on the principal plane through the gate insulation film, the method comprising the steps of:

forming the trench on the principal plane of the semiconductor substrate;

forming the gate insulation film on the principal plane of the semiconductor substrate including the inner wall of the trench;

forming the planer gate electrode on the principal plane of the semiconductor substrate through the gate insulation film together with forming the trench gate electrode in the trench through the gate insulation film;

forming the source region by an ion implantation method with using the planer gate electrode as a mask together with forming the base region;

increasing an impurity concentration of a portion of the base region by implanting ions of a second conductive type element at a slant, the portion of the base region to be a channel region facing the planer gate electrode;

forming a device separation trench disposed around a device-to-be-formed region of the semiconductor substrate;

forming an insulation film disposed on an inner wall of the device separation trench, wherein the insulation film is the same film as the trench gate insulation film of the trench gate electrode;

forming a film disposed in the device separation trench through the insulation film wherein the film is the same film as a film composing the trench gate electrode; and forming another insulation film disposed in the device separation trench through the film and the insulation film.

2. The method according to claim 1, wherein the insulation film is thicker than the trench gate insulation film of the trench gate electrode.

3. The method according to claim 1 wherein the device separation trench includes equal to or more than double trenches.

* * * * *